(12) United States Patent
Prakash et al.

(10) Patent No.: US 7,310,787 B2
(45) Date of Patent: Dec. 18, 2007

(54) ARRAY TRANSFORMATION IN A BEHAVIORAL SYNTHESIS TOOL

(76) Inventors: Shiv Prakash, 10688 SW. Cottonwood St., Tualatin, OR (US) 97062; Bryan Darrell Bowyer, 206 Ardus Dr., Newberg, OR (US) 97132; Peter Pius Gutberlet, 28810 SW. Ashland Dr., #255, Wilsonville, OR (US) 97070

( * ) Notice: Subject to any disclaimer, the term of this patent is extended or adjusted under 35 U.S.C. 154(b) by 173 days.

(21) Appl. No.: 10/383,274

(22) Filed: Mar. 7, 2003

(65) Prior Publication Data

US 2003/0172055 A1 Sep. 11, 2003

Related U.S. Application Data

(60) Provisional application No. 60/362,679, filed on Mar. 8, 2002.

(51) Int. Cl.
*G06F 17/50* (2006.01)
(52) U.S. Cl. .................................. 716/3; 716/18; 707/1
(58) Field of Classification Search .................... 716/1, 716/3, 18; 703/14–16; 717/114–118; 707/1
See application file for complete search history.

(56) References Cited

U.S. PATENT DOCUMENTS

| | | | |
|---|---|---|---|
| 3,624,616 A | 11/1971 | Patel | |
| 4,527,249 A | 7/1985 | Van Brunt | |
| 5,404,319 A | 4/1995 | Smith et al. | |
| 5,428,740 A | 6/1995 | Wood et al. | |
| 5,541,850 A * | 7/1996 | Vander Zanden et al. | .... 716/18 |
| 5,555,201 A | 9/1996 | Dangelo et al. | |
| 5,623,419 A | 4/1997 | Kundert | |
| 5,625,580 A | 4/1997 | Read et al. | |
| 5,634,115 A | 5/1997 | Fitzpatrick et al. | |
| 5,673,198 A | 9/1997 | Lawman et al. | |
| 5,727,187 A | 3/1998 | Lemche et al. | |

(Continued)

FOREIGN PATENT DOCUMENTS

GB 2367225 3/2002

OTHER PUBLICATIONS

Arnout, "SystemC Standard," *IEEE*, pp. 573-577 (2000).

(Continued)

*Primary Examiner*—Jack Chiang
*Assistant Examiner*—Naum B. Levin
(74) *Attorney, Agent, or Firm*—Klarquist Sparkman, LLP

(57) ABSTRACT

A behavioral synthesis tool for generating an integrated circuit design is described. The behavioral synthesis tool allows a designer to interactively allocate variables or arrays to memory resources without having to modify a source code description of the integrated circuit. The behavioral synthesis tool reads the source code description and generates a synthesis intermediate format stored in memory. The synthesis tool searches the in-memory synthesis intermediate format to find arrays for each process. The arrays are then listed in a graphical user interface (GUI). The GUI allows the designer to create memory resources, specifying the type of memory, the packing mode, etc. The designer is also provided the ability to vary the format among a plurality of formats used to pack arrays to memory during the memory packing process. Upon completion of modifying the memory allocation, the designer saves the changes and such changes are effectuated by automatically updating the synthesis intermediate format.

44 Claims, 18 Drawing Sheets

U.S. PATENT DOCUMENTS

| | | | |
|---|---|---|---|
| 5,764,951 A | | 6/1998 | Ly et al. |
| 5,847,969 A | * | 12/1998 | Miller et al. .................. 716/17 |
| 5,870,308 A | | 2/1999 | Dangelo et al. |
| 5,870,588 A | | 2/1999 | Rompaey et al. |
| 5,880,971 A | | 3/1999 | Dangelo et al. |
| 5,912,819 A | | 6/1999 | Kucukcakar et al. |
| 6,044,211 A | | 3/2000 | Jain |
| 6,053,948 A | * | 4/2000 | Vaidyanathan et al. ....... 703/14 |
| 6,145,117 A | | 11/2000 | Eng |
| 6,195,786 B1 | | 2/2001 | Raghunathan et al. |
| 6,305,006 B1 | | 10/2001 | Markov |
| 6,314,552 B1 | | 11/2001 | Markov |
| 6,467,075 B1 | | 10/2002 | Sato et al. |
| 6,477,683 B1 | * | 11/2002 | Killian et al. .................. 716/1 |
| 6,477,689 B1 | | 11/2002 | Mandell et al. |
| 6,480,985 B1 | | 11/2002 | Reynolds et al. |
| 6,574,708 B2 | * | 6/2003 | Hayter et al. ............... 711/118 |
| 6,611,952 B1 | * | 8/2003 | Prakash et al. ............... 716/18 |
| 6,691,301 B2 | * | 2/2004 | Bowen ....................... 717/114 |
| 6,701,501 B2 | | 3/2004 | Waters et al. |
| 6,704,914 B2 | | 3/2004 | Nishida et al. |
| 6,708,144 B1 | | 3/2004 | Merryman et al. |
| 6,711,729 B1 | | 3/2004 | McElvain et al. |
| 6,760,888 B2 | * | 7/2004 | Killian et al. .................. 716/1 |
| 6,769,081 B1 | * | 7/2004 | Parulkar ..................... 714/733 |
| 6,917,909 B1 | | 7/2005 | Markov et al. |
| 2002/0097269 A1 | | 7/2002 | Batcha et al. |
| 2004/0111692 A1 | | 6/2004 | Bowyer et al. |
| 2004/0143801 A1 | | 7/2004 | Waters et al. |

OTHER PUBLICATIONS

Cong et al., "Combinatorial Logic Synthesis for LUT Based Field Programmable Gate Arrays," *ACM Transactions on Design Automation of Electronic Systems*, vol. 1, No. 2, pp. 145-204 (Apr. 1996).

Cong et al., "FlowMap: An Optimal Technology Mapping Algorithm for Delay Optimization in Lookup-Table Based FPGA Designs," *IEEE Trans. on Computer-Aided Design*, vol. 13, No. 1, pp. 1-12 (Jan. 1994).

De Micheli et al., "The Olympus Synthesis System," *IEEE Design & Test of Computers*, pp. 37-53 (Oct. 1990).

Francis et al., "Chortle-crf: Fast Technology Mapping for Lookup Table-Based FPGAs," *28th ACM/IEEE Design Automation Conference*, pp. 227-233 (1991).

Kim et al., "Utilization of Multiport Memories in Data Path Synthesis," *30th ACM/IEEE Design Automation Conference*, pp. 298-302 (1993).

Liao et al., "An Efficient Implementation of Reactivity for Modeling Hardware in the Scenic Design Environment," *34th ACM/IEEE Design Automation Conference*, pp. 70-75 (1997).

Lipton et al., "PDL++: An Optimizing Generator Language for Register Transfer Design," *ISCAS-90*, pp. 1135-1138 (1990).

Marwedel et al., "RAM-Based Architectural Synthesis," *Novel Approaches in Logic and Architecture Synthesis*, G. Saucier, Ed. Chapman & Hall, London, UK, pp. 233-244 (1995).

Prakash et al., "Techniques for Rapid Implementation of High-Performance FPGAs from Algorithmic C Specification," *HDLCon 2001 Technical Program*, 9 pp. (Mar. 2001).

Ramachandran et al., "An Algorithm for Array Variable Clustering," *Proceedings of the IEEE European Conference on Design Automation (EURO-DAC '93)*, pp. 262-266.

Séméria et al., "Methodology for Hardware/Software Co-verification in C/C++," *Proc. IEEE International High Level Design Validation and Test Workshop HLDVT'99*, 4 pp. (Nov. 1999).

Wolf, "Object-Oriented Co-Synthesis of Distributed Embedded Systems," pp. 553-558 (also published as Wolf, "Object-Oriented Co-Synthesis of Distributed Embedded Systems," TODAES 1 3:301-314 (1996)).

Zhu et al., "Syntax and Semantics of the SpecC+ Language," *Technical Report ICS-97-16*, pp. 1-12 (Apr. 1997).

"Innovations in Behavioral Design and Synthesis," Downloaded from http://cynapps.com on Jun. 6, 2003.

PCT International Search Report, dated Jun. 19, 2003, 5 pp.

Schmit et al., "Synthesis of Application-Specific Memory Designs," *IEEE Transactions on Very Large Scale Integration (VLSI) Systems*, vol. 5, No. 1, pp. 101-111 (1997).

U.S. Appl. No. 60/257,923, filed Sep. 19, 2002, Prakash et al.

Antao et al., "ARCHGEN: Automated Synthesis of Analog Systems," *IEEE Transactions on Very Large Scale Integration (VLSI) Systems*, pp. 231-244 (Jun. 1995).

Antao, "Architectural Exploration for Analog System Synthesis," *Proceedings of the IEEE Custom Integrated Circuits Conference*, pp. 529-532 (May 1995).

Antoniazzi et al., "A Methodology for Control-Dominated Systems CoDesign," *Third International Workshop on Hardware/Software Codesign*, pp. 2-9 (Sep. 1994).

Buonanno et al., "Application of a Testing Framework to VHDL Descriptions at Different Abstraction Levels," *IEEE International Conference on Computer Design: VLSI in Computers and Processors*, pp. 654-659 (Oct. 1997).

Camposano, "From Behavior to Structure: High Level Synthesis," *IEEE Design & Test of Computers*, pp. 8-19 (Oct. 1990).

Camposano et al., "Synthesizing Circuits From Behavioral Descriptions," *IEEE Trans. on Computer-Aided Design*, vol. 8, No. 2, pp. 171-180 (Feb. 1989).

Elliott, *Understanding Behavioral Synthesis: A Practical Guide to High-Level Design*, Ch. 2, pp. 5-23, and Ch. 9, pp. 155-172, Kluwer Academic Publishers (1999).

Fuhrman, "Industrial Extensions to University High Level Synthesis Tools: Making it Work in the Real World," *Proceedings of the 28th Conference on ACM/IEEE Design Automation Conference*, pp. 520-525 (Jun. 1991).

Goering, "Cadence Mounts Synthesis Threat," Electronic Engineering Times, 3 pp., downloaded from http://eetimes.com/news/97/939news/threat.html (document published in 1997).

Goldberg, "Visual Architect Bridges the Gap Between Systems and ASIC Designers," 4 pp. downloaded from http://www.edacafe.com/technical/papers/Cadence/archive/vol2No2/visualArc.php.

Hsu et al., "Digital Design From Concept to Prototype in Hours,"*IEEE Asia-Pacific Conference on Circuits and Systems*, pp. 175-181 (Dec. 1994).

Jemai et al., "Architectural Simulation in the Context of Behavioral Synthesis," *Proceedings of the Design Automation and Test in Europe*, pp. 590-595 (Feb. 1998).

Kucukcakar et al., "Matisse: An Architectural Design Tool for Commodity ICs," *IEEE Design & Test of Computers*, vol. 15, Issue 2, pp. 22-33 (Apr.-Jun. 1998).

Ly et al., "Applying Simulated Evolution to High Level Synthesis," *IEEE Transactions on Computer-Aided Design of Integrated Circuits and Systems*, pp. 389-409 (Mar. 1993).

Ly et al., "Scheduling using Behavioral Templates," *Proceedings of the 32nd ACM/IEEE Design Automation Conference*, pp. 101-106 (Jun. 1995).

McFarland et al., "The High-Level Synthesis of Digital Systems," *Proceedings of the IEEE*, vol. 78, No. 2, pp. 301-318 (Feb. 1990).

Middelhoek et al, "From VHDL to Efficient and First-Time-Right Designs: A Formal Approach," *ACM Transactions on Design Automation of Electronic Systems*, vol. 1, No. 2, pp. 205-250 (Apr. 1996).

Park et al., "Sehwa: A Software Package for Synthesis of Pipelines from Behavioral Specifications," *IEEE Transactions on Computer-Aided Design of Integrated Circuits and Systems*, pp. 356-370 (Mar. 1988).

Patel, "A Design Representation for High Level Synthesis," *Proceedings of the European Design Automation Conference*, pp. 374-379 (Mar. 1990).

Perkowski et al., "Diades, A High Level Synthesis System," *IEEE International Symposium on Circuits and Systems*, pp. 1895-1898 (May 1989).

Schneider, "A Methodology for Hardware Architecture Trade-off at Different Levels of Abstraction," *European Design and Test Conference*, pp. 537-541 (Mar. 1997).

Shirai, "A Design System for Special Purpose Processors Based on Architectures for Distributed Processing," *Proceedings of the Design Automation Conference*, pp. 380-385 (Sep. 1995).

Tanir et al., "A Specification Driven Architectural Design Environment," *Computer*, pp. 26-35 (Jun. 1995).

Thomas, "The System Architect's Workbench," *Proceedings of the 25th Design Automation Conference*, pp. 337-343 (Jun. 1988).

Walker et al., "Behavioral Transformation for Algorithmic Level IC Design," *IEEE Transactions on Computer-Aided Design of Integrated Circuits and Systems*, pp. 1115-1128 (Oct. 1989).

Walker et al., "Increasing User Interaction During High Level Synthesis," *Proceedings of the 24th Annual International Symposium in Microarchitecture*, pp. 133-142 (Nov. 1991).

Zivojnovic et al., "LISA—Machine Description Language and Generic Machine Model for HW/SW Co-Design," *IEEE Workshop on VLSI Signal Processing*, pp. 127-136 (Oct. 1996).

* cited by examiner

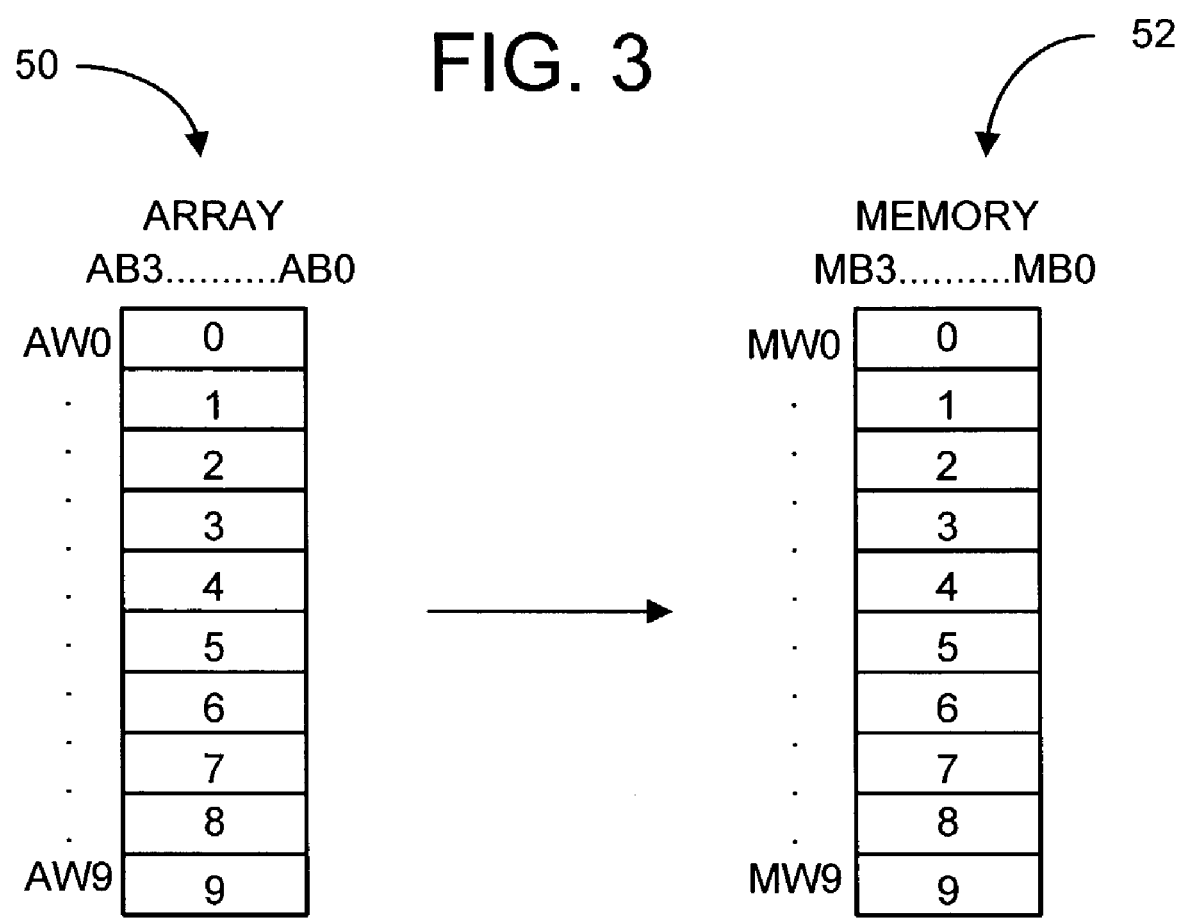

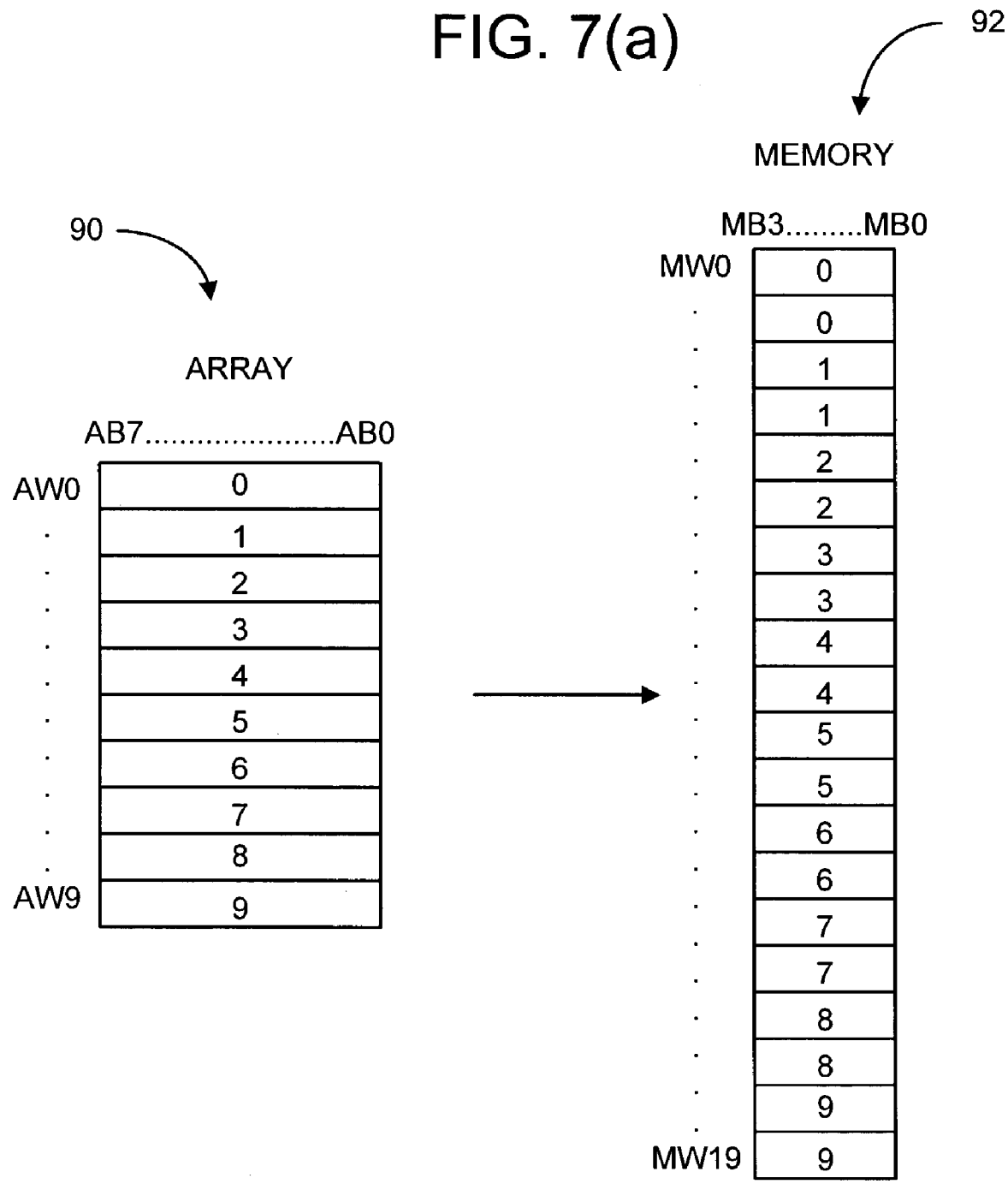

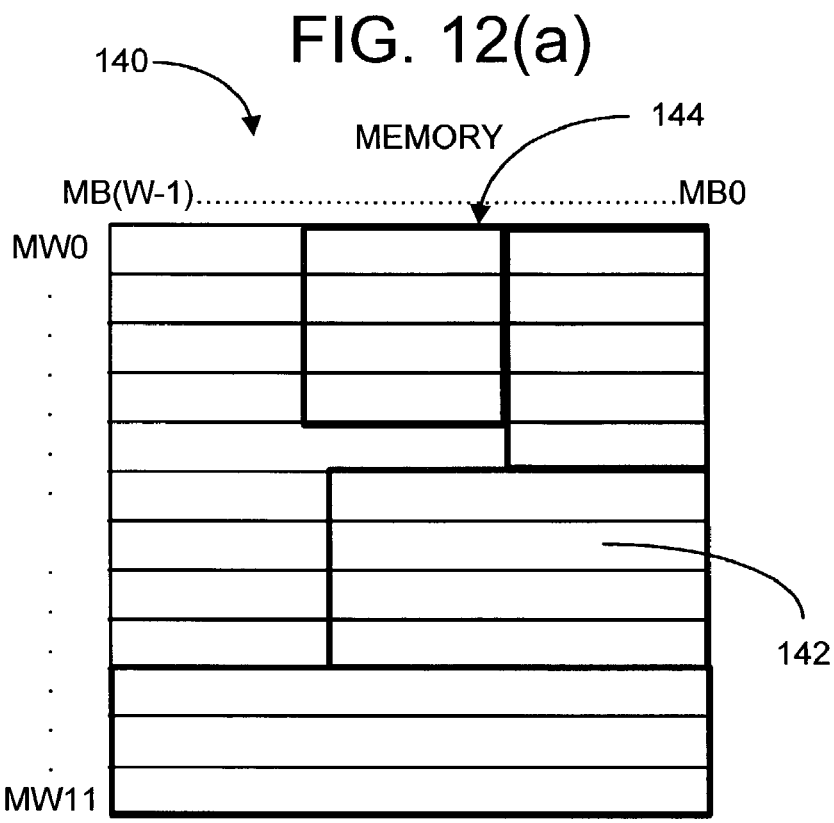
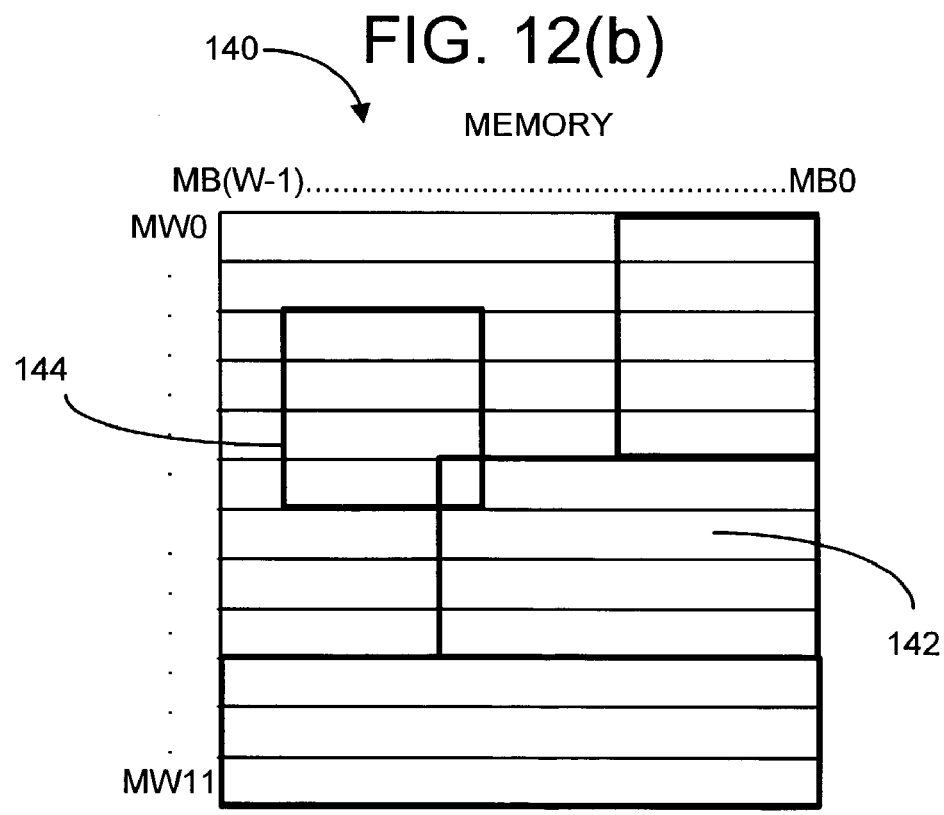

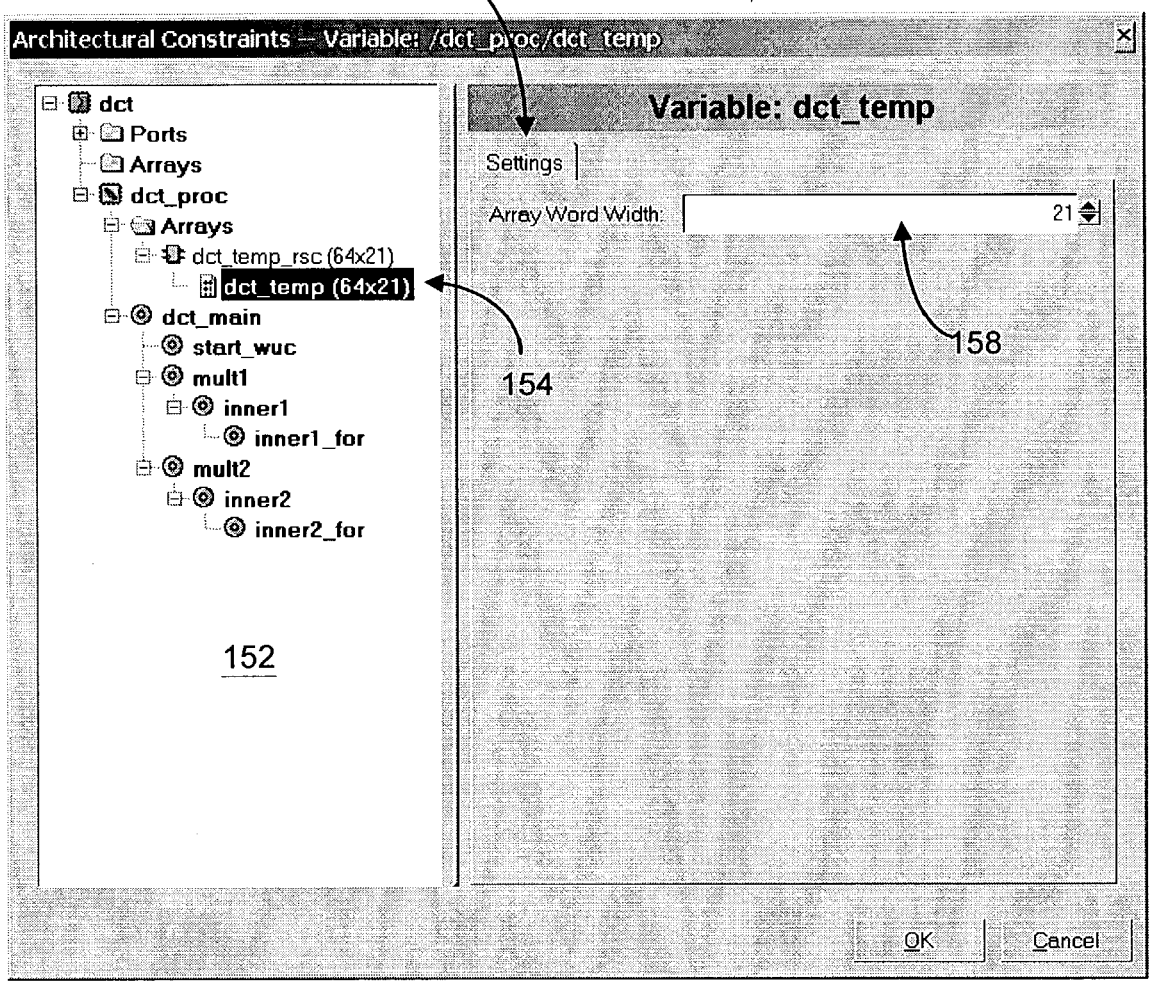

FIG. 16(a)

160 →
```
int32 A[100]
.
.
.
b = A[5]
c = A[9]
```

FIG. 16(b)

162 →
```
int64 A[50]
.
.
.
b = A[2] (63...32)
c = A[9] (31...0)
```

FIG. 16(c)

164 →
```
CONSTRAINT ARRAY_SIZE (64,50)
int32 A[100]
.
.
.
b = A[5]
c = A[9]
```

ARRAY TRANSFORMATION IN A BEHAVIORAL SYNTHESIS TOOL

RELATED APPLICATION DATA

This application claims the benefit of the earlier filing date of U.S. Provisional Application No. 60/362,679, filed Mar. 8, 2002. The entire disclosure of U.S. Provisional Application No. 60/362,679 is incorporated herein by reference.

FIELD OF THE INVENTION

The present invention relates generally to behavioral synthesis tools for creating integrated circuits, and more particularly relates to behavioral synthesis tools that provide for improved packing of arrays to memory.

BACKGROUND

With the proliferation of data-intensive applications, such as sound, image and video processing, the memory subsystem has become an important focus of electronic system design. More than three-quarters of a data-intensive system can be made up of storage components, making the memory subsystem the most crucial part of the design of an integrated circuit. Most of these systems need to be high-speed due to the large amounts of data involved and must be designed carefully to avoid a solution that is larger than expected.

The design of an integrated circuit no longer begins with a circuit diagram. Instead, it begins with a software program that describes the behavior or functionality of a circuit. This software program is a source code description that defines an algorithm to be performed with limited implementation details. Designers direct behavioral synthesis tools to convert the source code description into a register transfer level (RTL) description. The RTL description is used to ultimately generate a netlist that includes a list of components in the circuit and the interconnections between the components. This netlist is used to create the physical integrated circuit.

Arrays provide a powerful and convenient method for modeling the behavior of memories in source code descriptions. That is, behavioral descriptions are used to manipulate groups of data in an abstract manner using arrays. These arrays are, under the control of the designer, packed to memory. Behavioral synthesis tools automatically construct the logic to control the memory, freeing the designer to explore architectures using different memories with different characteristics (e.g., synchronous versus asynchronous, single port versus dual port), and make intelligent decisions about an appropriate implementation for a design.

To pack arrays to a memory, the designer must specifically assign the variables representing the arrays to a memory in source code and specify the type of memory and other memory parameters. This is accomplished using a set of attributes or directives. For example, Synopsis® tools use a "pragma" statement.

After the designer designates the details of memory allocation in the source code description (using pragma statements or other directives), the designer runs the source code description through the synthesis tool. The synthesis tool generates a report that the designer can use to analyze the performance of the circuit. For example, the user can examine the speed and area of the circuit to determine whether the current memory allocation is acceptable. If the memory allocation is not acceptable, the designer must return to an editor, re-edit the source code description to change the details of memory allocation, and run the source code description through the synthesis tool again. Such a technique for modifying the memory allocation is time consuming and inefficient and gives the designer only a limited amount of options for designating how memory will be allocated.

It is desirable, therefore, to provide a method and synthesis tool that allows a designer to modify memory resources more quickly and simply as well as provide the designer with more advanced options for specifying how arrays will be packed to memory.

SUMMARY

Methods, systems, and behavioral synthesis tools are provided that allow a designer to change the format of how an array is packed to memory during the memory packing process when converting a source code description of a circuit to an RTL description. The designer can write a source code description at the algorithmic level describing the behavior of the circuit to be designed. The designer then uses a behavioral synthesis tool to generate a number of different architectural designs using synthesis techniques. Each design can implement differing memory allocation by allowing the designer to change a number of different constraints such as whether to use RAMs vs. registers, which type of RAM to use, how many memories to use, whether to use on or off-chip memory, etc. The designer is also provided the ability to transform the layout format of the arrays in the source code description such that the designer can quickly and easily control the packing of the arrays into the chosen memories. These constraints can be changed either using a graphical user interface, changing constraints within the behavioral synthesis tool, or by manually manipulating the source code description. The behavioral synthesis tool then creates a report for each design to analyze the performance of the circuit. For example, the designer can examine and compare the speed and area of the circuits created from each of the designs to determine whether the memory performance and size are acceptable.

A source code file having a description of the hardware is read into a database within the behavioral synthesis tool. The behavioral synthesis tool analyzes the source code description and generates a data structure associated with the source code description. The designer can then modify a number of constraints dictating the details of memory allocation such as type of memory, number of memories, memory size, etc. Thus, rather than having to re-edit the source code description, the designer can change these memory constraints interactively and dynamically during the memory packing process to control how arrays are packed into memory. Once the designer is satisfied with the design, an RTL description is produced from the data structure.

A number of additional options for packing arrays into memory are provided by the behavioral synthesis tool to the designer so that the designer may select one of a plurality of array layout formats during the memory packing process. Providing the designer the ability to transform the layout of arrays dynamically allows the designer a fast, efficient method of customizing the memory allocation of the circuit to be synthesized.

Further features and advantages of the invention will become apparent with reference to the following detailed description and accompanying drawings.

BRIEF DESCRIPTION OF THE DRAWINGS

FIG. 3 is an illustration of directly packing an array to a memory.

FIG. 7(a) is an illustration of packing a single word of an array into multiple words of a memory.

FIG. 13 shows an example of a user interface allowing the designer to modify memory resources in a behavioral synthesis tool.

FIG. 16 is an example of applying memory allocation to a SIF.

DETAILED DESCRIPTION

Figure 1:
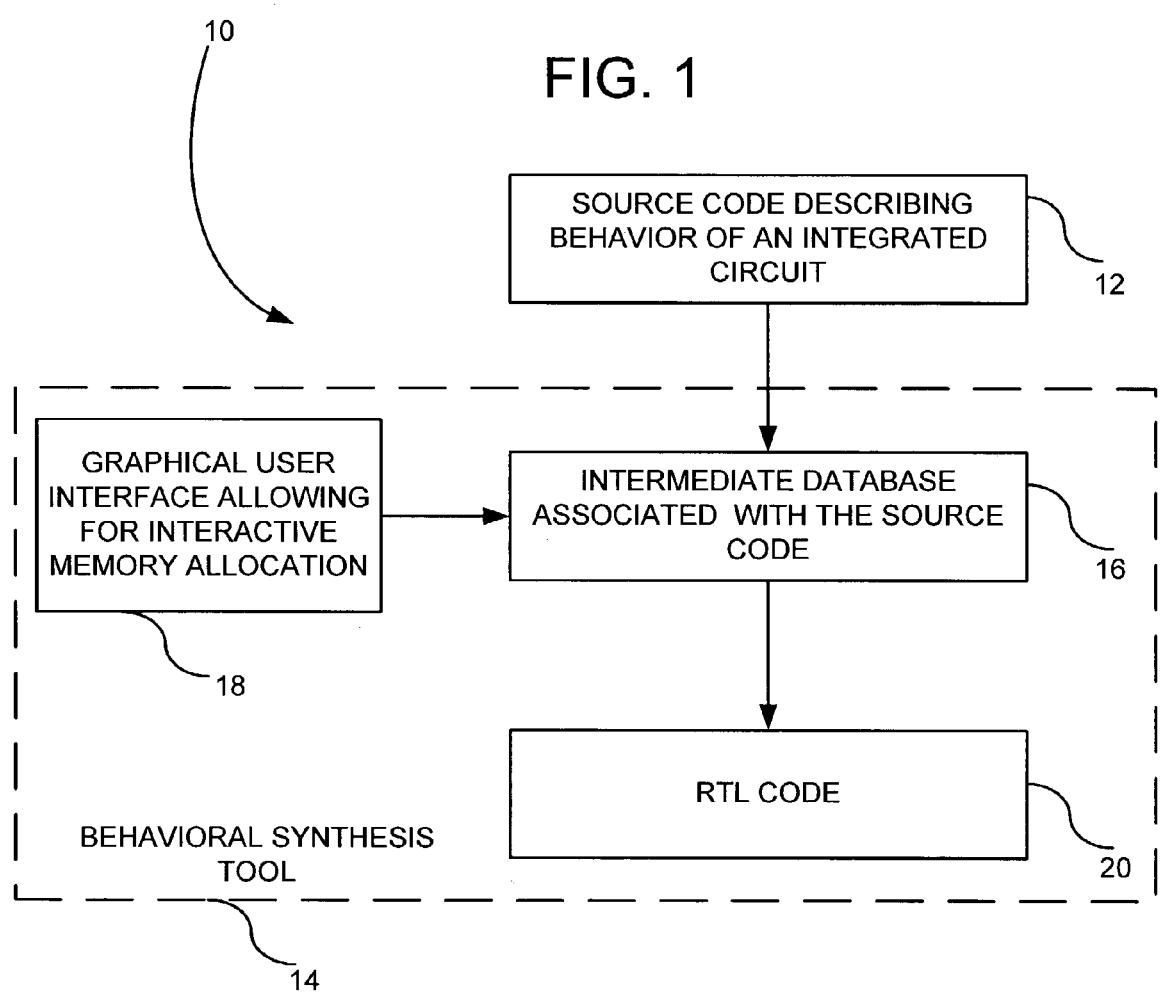
FIG. 1 is a block diagram of a system for allowing interactive memory allocation.

FIG. 1 shows a system 10 for generating an integrated circuit. A designer typically creates a behavioral description of an integrated circuit by generating source code 12 using a separate editor (not shown). The source code description may be written in any programming language capable of describing a circuit at the behavioral level, such as C, C++, VHDL, Verilog, Pascal, etc. Once the source code description 12 is complete, a behavioral synthesis tool 14 reads in the source code description 12 and allows a designer to evaluate and modify the circuit architecture early in the design process. In particular, the source code description 12 is read into an intermediate database 16 that holds the behavioral description as a data structure. This data structure, called a synthesis intermediate format (SIF), is modifiable by the user through a graphical user interface (GUI) 18. The GUI 18 allows the designer to interactively and dynamically modify the memory allocation in the data structure. However, the designer may also modify the memory allocation by manually editing the original source code description, or modifying the SIF without the assistance of a GUI. For instance, the designer may issue commands to modify the memory allocation within the SIF. The designer may then quickly evaluate the area and latency associated with different memory architectures. Once the designer is satisfied with the architecture, the RTL code is generated as shown at 20. Further processing is then performed on the RTL code to ultimately generate the integrated circuit.

Figure 2:
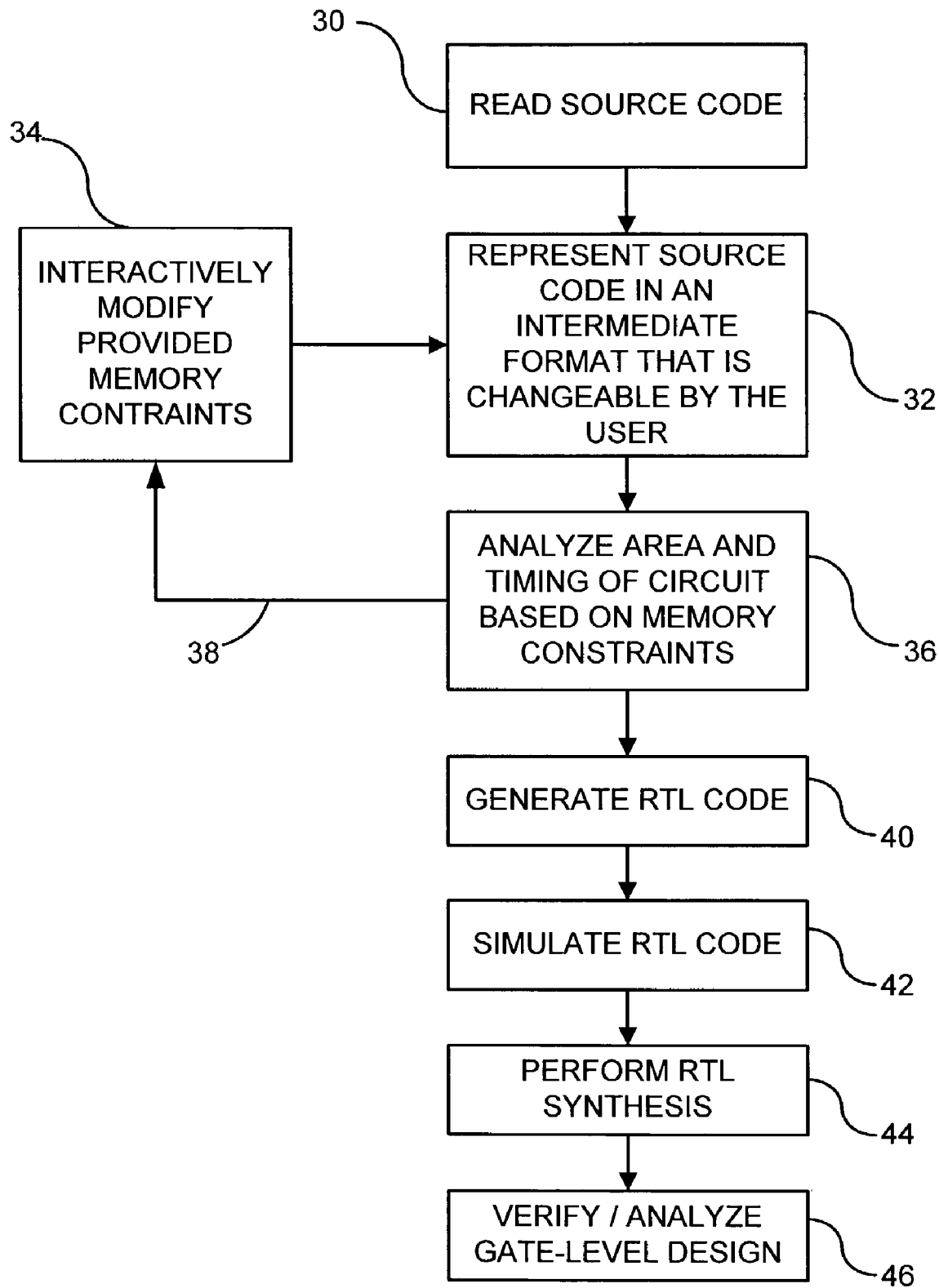
FIG. 2 is a detailed diagram illustrating a design flow for creating an integrated circuit using the system of FIG. 1.

FIG. 2 shows a more detailed flow chart for generating an integrated circuit according to one embodiment of the invention. In process block 30, the behavioral synthesis tool reads in the source code describing the behavior of the integrated circuit as already described. The source code description can include a default set of constraints to establish the original memory allocation. Alternatively, the default constraints can be provided by a selected packing mode, or by the designer once the source code description is read into the behavioral synthesis tool. In process block 32, the behavioral synthesis tool 14 (see FIG. 1) reads the source code description into the intermediate database 16 and generates a data structure that is changeable by the designer. When generating the data structure, the synthesis tool performs an analysis of the source code description. For example, the synthesis tool searches for operators, signals, and variables in the source code description and generates the data structure based on these statements. Additionally, the synthesis tool searches for directives and uses the directives as defaults for the memory allocation in the data structure.

At this point in the flow, the memory allocation information is stored in the intermediate database independently, meaning the information is not yet fully integrated into the SIF. This allows the designer to interactively change the memory allocation and control when such changes are applied to the SIF. The memory allocation information is stored as a set of resources for the design, wherein each resource represents a memory resource that may potentially be present in the final integrated circuit design. Additionally, arrays in the source code description are also stored in the data structure. The data structure may be organized in many different ways. One possible organization is to have various fields associated with the resources and arrays stored in the data structure. For instance, in one embodiment the following fields could be associated with a resource stored in the data structure:

A unique identification for the resource
A type of memory to be used for the resource
A list of variables packed to the resource
A packing mode for the resource
A flag indicating whether the resource is external to the design
A format for packing variables to the resource Likewise, in one embodiment the following fields could be associated with arrays stored in the data structure:

A unique identification for the resource
An array length
An array width
A start address in a resource
A start bit in the resource
A format for packing the array to the resource In process block 34, the designer can interactively change the memory allocation for variables that are in the source code description. That is, the source code description includes variables representing arrays that are associated with memory storage (although in some cases arrays are not packed to memory). The memory allocation for variables representing the arrays is modified by allowing the designer to manipulate a number of constraints relating to memory allocation. For instance, a first constraint may allow the designer to choose from the many different memories available in circuit design. Additional constraints may vary the size and type of memory selected (e.g., dual port memory, single port memory, etc.). Thus, in process block 34, the designer can choose which memories to use, the variables associated with those memories, the packing mode, etc.

In order to give the designer more flexibility in design, the designer is also provided the ability in process block 34 to transform the layout of the arrays into a variety of formats. The format used to pack an array to memory can have a significant impact on the overall memory performance of the circuit. Often the format used will dictate the number of reads and/or writes necessary to access a given number of words of an array or memory. Various formats can be chosen that emphasize keeping the size of the circuit within given specifications, while other formats can be chosen that emphasize the speed of the circuit (reducing the number of clock cycles/reads/writes). Specific array layout formats will be discussed at length with respect to FIGS. 3–11.

The designer can modify any of the memory allocation constraints discussed above (i.e. size, number, and type of memories, packing mode, formats) in a number of ways. The designer can use the GUI 18 shown in FIG. 1 to change constraints controlling memory allocation. Alternatively, the designer could manually change the constraints in the SIF or manually edit the source code description to include the constraint.

After memory is properly allocated, the designer can perform an initial check to analyze the area and timing of the circuit (process block 36). This may be done, for example, by displaying an area versus latency graph that gives the designer some immediate feedback on whether the memory allocation is satisfactory. If the designer is unhappy with the area or timing, the designer can return to process block 34 to further modify the memory allocation, as shown by arrow 38. On the other hand, if the designer is satisfied with the memory allocation, the RTL code can be generated and simulated (process blocks 40 and 42). Finally, an RTL synthesis tool can perform RTL synthesis (process block 44) and the gate level design can be verified and analyzed (process block 46).

For each array or memory, there is a fixed data block, which is read from or written into it at the same time. This fixed data block is called a word. An array or memory can be characterized by the size and number of words. The first parameter of a memory or array is the word size, which is the number of bits read or written in a single access. The second parameter is the number of words a memory can store. Each word has a unique address under which it can be read or written, which is usually a number from 0 to the wordcount−1. Arrays can usually be indexed by an expression which is computed during runtime. Memories as hardware units can have additional parameters such as delays and number of ports.

Further details are now given on how the memory allocation is applied to the SIF. After the designer is satisfied with the memory allocation, the designer directs the GUI to apply the memory allocation information to the SIF. Thus, at this point any changes the designer has made to the memory allocation are reflected in the database by modifying the independent set of resources and their field information. Applying this information to SIF involves several steps:

1. Create a memory data object representing each memory resource. This involves determining the size of the memory based on the variables packed to the memory and the size of the variables, along with the packing mode. Also, since the original variable index may get packed to a different memory address (based on the packing mode and the order of variables on the memory), offsets are computed for each array/index.

2. Transform all read/write accesses to any of the variables packed to the memory resource into corresponding read/write(s) to the created memory data object in step 1. Transforming includes modifying the SIF appropriately to reflect the packing of the original array index to the actual memory address location. This packing is dependent on the ordering of the variables and the packing mode used. An appropriate offset is inserted for each array index access. This offset insertion is also known as address calculation.

Referring to FIG. 16, an example is given of how memory allocation is applied to the SIF. FIG. 16 shows three segments of code. The first code segment 160 is sample of basic code for declaring an array A and then assigning various words of the array to variables. In segment 160, array A is declared with an array length of 100 and word width of 32 bits. Subsequently, word 5 of array A is assigned to variable b and word 9 of array A is assigned to variable c.

Assume for purposes of this example that the designer has read code segment 160 into a behavioral synthesis tool and now wishes to transform the format of this array such that it is only 50 words in width, and 64 bits wide. At this point using prior methods, the designer would have to re-edit source code segment 160 to reflect the change, both when declaring the array and whenever the array is accessed, as shown in code segment 162. Code segment 162 shows the declaration of array A changed to reflect the new size, but also the changes that must be made to the subsequent accesses to the array. In order to ensure the array accesses will still assign the correct word of array A after the size change, a new address must be calculated for the desired word. Depending on the changes made, this calculation could be quite difficult. Thus, manually producing this new code requires substantial editing time on the part of the designer and is error prone even for the simplest code such as that shown in FIG. 16. Code written to describe the behavior of integrated circuits is often much more complex, and therefore the time and possibility of error rise accordingly.

However, the behavior synthesis tool of the current embodiment allows the designer to simply change a constraint to transform the layout of array A from 100 by 32 to 50 by 64. Since the source code segment 160 has already been read into the SIF, a provided GUI will display the array A along with its current size, 100 by 32. The designer then changes a size constraint for the array indicating the array should be transformed to a 50 by 64 format. Once confirmed, the constraint within the SIF for the size of array A is changed to reflect the designer's desired change, and the behavioral synthesis tool creates RTL code reflecting any changes in the constraints. In other words, even though code segment 160 was read into the SIF, due to the designer's configuration of the constraints through the GUI, the RTL code is created as if the code segment 162 had been originally read in. This can be accomplished by the behavioral synthesis tool by actually creating and editing the code segment 160 to reflect the functionality of code segment 162, editing the SIF of code 160 to reflect the functionality of code segment 162, or leave code segment 160 unchanged yet still create RTL code to reflect the functionality of code segment 162.

Alternatively, in another embodiment, the designer could have manually added a size constraint to the source code segment 160, such as that shown in code segment 164, and then read in code segment 164 to the SIF. In yet another embodiment, the size constraint within the SIF could be changed manually by the designer without the assistance of a GUI.

Allowing a designer control over how arrays are packed to memory during the memory packing process in synthesizing an integrated circuit is desirable because the chosen architecture will have a significant impact on the performance of the memory system. For example, depending upon how the array words are accessed, it may be more effective to have the RAM word size different from the array word size. If two consecutive words from the array are accessed together, it may be efficient to pack two array words into a single RAM word. Or, conversely, if half of the array word is accessed often, it may be effective to split the array word into two RAM words.

Consider two arrays A (word size: 16) and B (word size: 32) are to be packed together. The RAM word size could be chosen to be, for instance, 16 or 32. If a designer chooses 32, the array A words could be zero-padded to make all A and B words the same size. The solution just suggested is obviously quite wasteful in terms of memory usage. Another solution would be to pack two array A words into a single RAM word. A third solution would be to choose 16 as the RAM word size, and split each array B word into two RAM words. A choice between the second and third formats would be dictated by word access patterns for the two arrays. Often there are numerous formats available for the same design description, each having advantages and disadvantages compared to other formats.

FIG. 3 is an illustration of directly packing an array to a memory. In this example, array 50 and memory 52 are the same length (10 words) and width (4 bits). However, array 50 could also be packed to a sub-section of a larger memory. In order to pack array 50 to memory 52, word 0 of array 50 is packed directly to word 0 of memory 52, as are subsequent words 1 through 9. Each array access results in one memory access. There is no address conversion and array addresses can be used directly as memory addresses. Therefore, direct packing is fairly simple and is processed by the behavioral synthesis tool quickly.

Figure 4A:
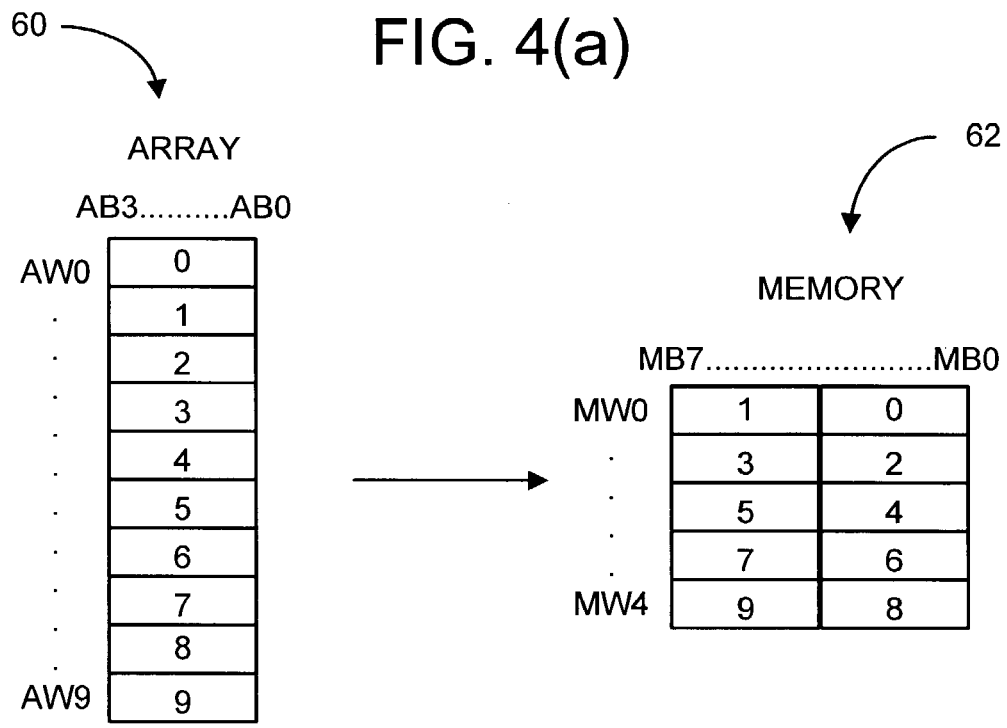
FIG. 4(a) is an illustration of packing multiple words of an array into a single word of a memory.

In many cases, access to memory elements is the bottleneck of a design, because it limits the maximum parallelism of the performed functionality. One option is to increase the width of a memory word, so each memory access reads or writes multiple array words. Packing an array to a memory with larger word size is a typical transformation to increase the throughput of the memory port as an alternative to memories with multiple ports. FIG. 4(a) is an illustration of packing multiple words of an array into a single word of a memory. Array 60 shown in FIG. 4(a) has a length of 10 words and width of 4 bits. Array 60 is packed to a memory 62 that is 8 words in width, or twice the word width of array 60. Therefore, words 0 and 1 of array 60 can be packed into word 0 of memory 62. Likewise, words 2 and 3 of array 60 are packed to word 1 of memory 62, and so on.

Figure 4B:
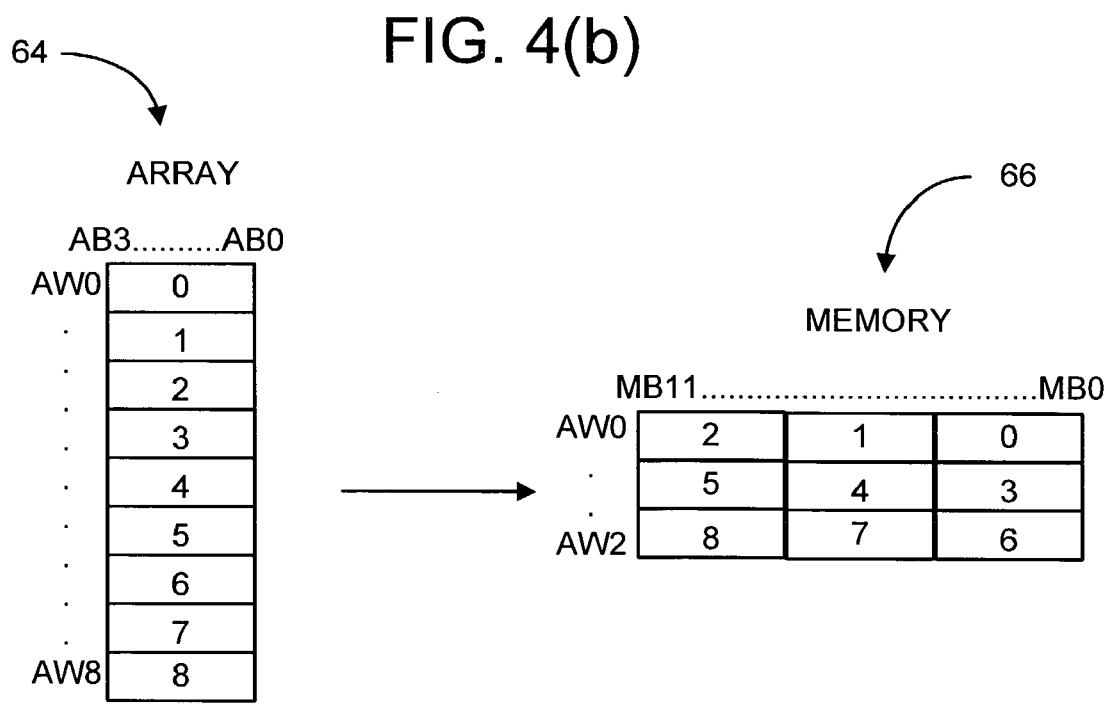
FIG. 4(b) is another illustration of packing multiple words of an array into a single word of a memory.

FIG. 4(b) is another illustration of packing multiple words of an array into a single word of a memory. Array 64 in FIG. 4(b) has a word width of 4 bits. However, memory 66 has word width 12, or three times the word width of array 64. Therefore, words 0, 1 and 2 of array 64 can be packed into word 0 of memory 66. Likewise, words 3, 4 and 5 of array 64 are packed to word 1 of memory 66, and so on.

Packing multiple array words to a single word of memory requires each array access to be transformed into a memory access, where certain address calculations and sub-selections of memory words have to be performed. Writing an element of the array requires reading the memory word first or the array element sharing the same memory word is not overwritten. In other words, each array read transforms into a memory read and an array write transforms into multiple memory accesses. A designer would therefore find this format useful if multiple array accesses can be packed to a single memory access. This may be the case when the source code description contains numerous loops that access the array elements in sequential order, or if the source code description always, or often, accesses the array words in pairs.

Figure 5A:
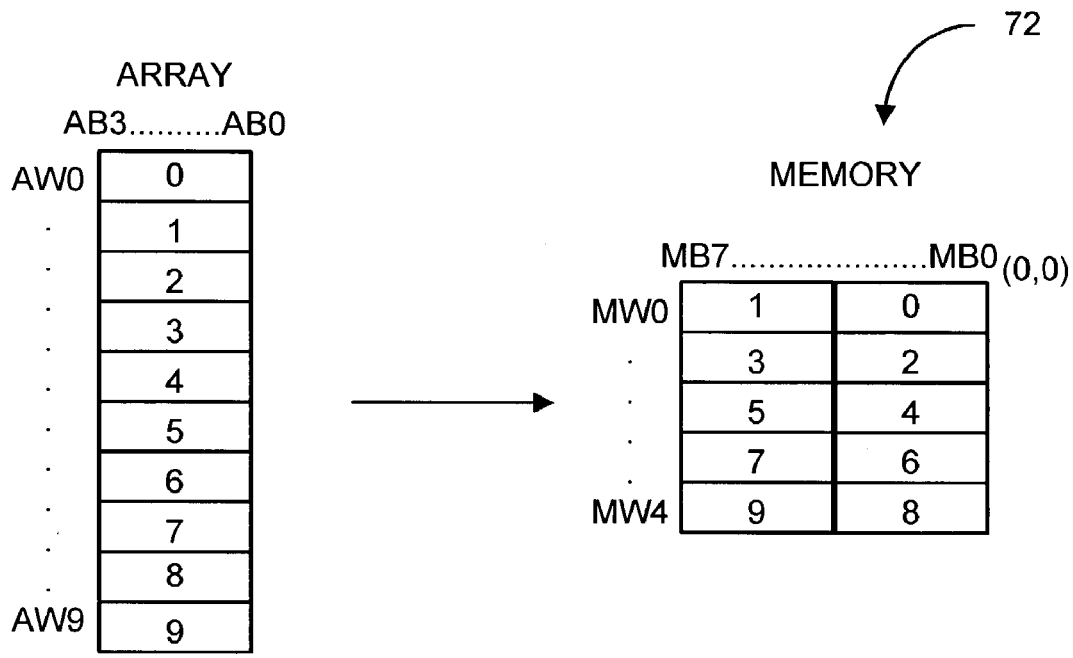
FIG. 5(a) is an illustration of packing an array into a memory using a Little Endian format.
Figure 5B:
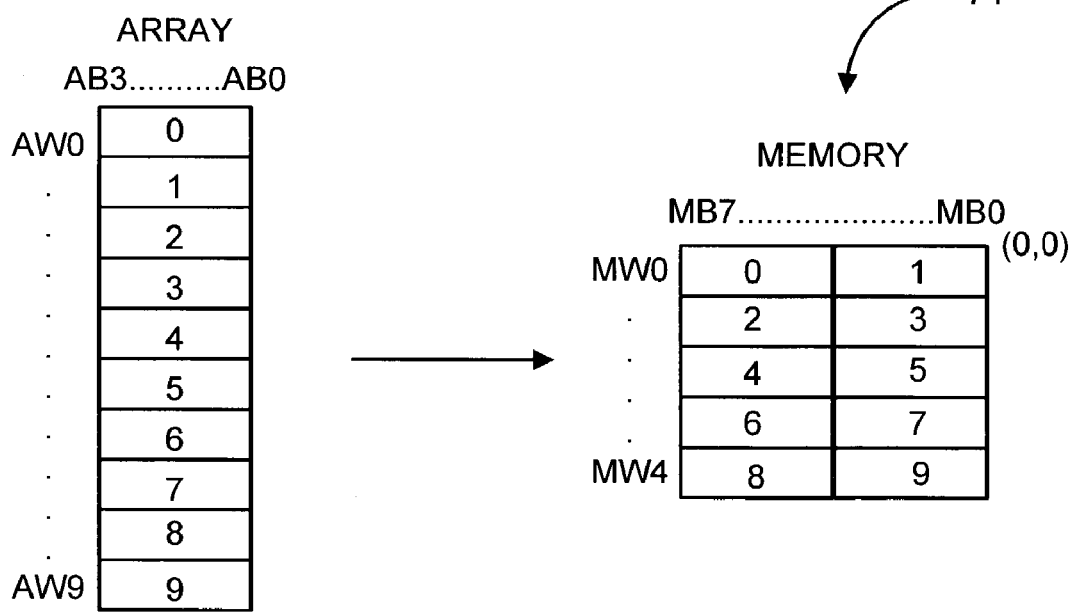
FIG. 5(b) is an illustration of packing an array into a memory using a Big Endian format.

FIGS. 5(a) and 5(b) are illustrations of packing an array into a memory using Endian formats. Array 70 in FIGS. 5(a) and 5(b) has an array length of 10 and word width of 4 bits. Array 70 is packed to a memory 72 with a word width of 8 bits, with two array words being packed to a single memory word, as discussed previously with respect to FIG. 4(a). However, the format, or the word width or length of the array or memory, are not important for purposes of using Endian formats. Endian formats, like all of the formats described herein, can be used in combination with other formats to transform array layouts.

FIG. 5(a) is an illustration of packing an array into a memory using a "Little Endian" format. This format packs array 70 to memory 72 beginning at the least significant bit of each word of memory 72. Therefore, memory 72 in FIG. 5(a) shows words 0 and 1 of array 70 packed to word 0 of memory 72 starting at the least significant bit, words 2 and 3 of array 70 packed to word 1 of memory 72 starting at the least significant bit, and so on. Little Endian format is used by most Intel processors for personal computers using a Microsoft Windows platform.

FIG. 5(b) is an illustration of packing array 70 into memory 74 using a "Big Endian" format. This format packs array 70 to memory 74 beginning at the most significant bit of each word of memory 74. Therefore, memory 74 in FIG. 5(b) shows words 0 and 1 of array 70 packed to word 0 of memory 74 starting at the most significant bit, words 2 and 3 of array 70 packed to word 1 of memory 74 starting at the most significant bit, and so on. Big Endian format is used by most Motorola processors for personal computer using a Macintosh platform.

Figure 6A:
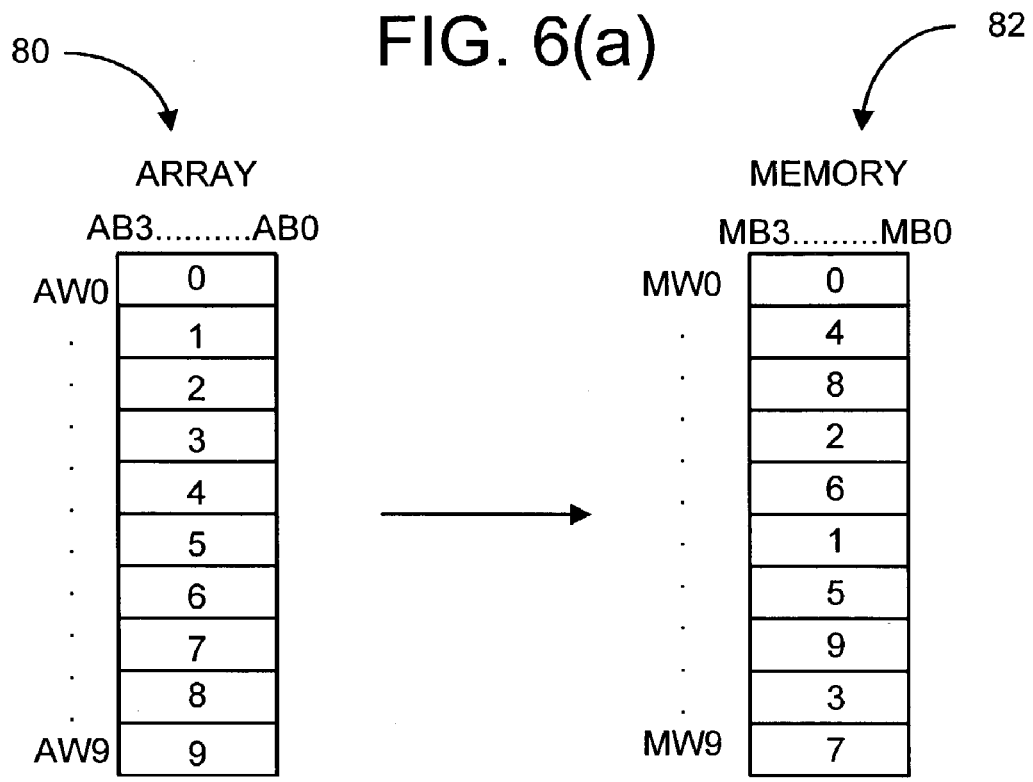
FIG. 6(a) is an illustration of packing an array into memory in an interlacing format.

Interlacing is a format which skips a specified number of words when reading from an array in order to pack the words to memory in a given order. A typical application would be if the odd addressed and even addressed words of the array are used in separate parts of the algorithm. FIG. 6(a) is an illustration of packing an array into memory in an interlacing format. Array 80 can be packed in an interlacing format skipping three words for every word packed such that the even words of array 80 are packed to the first five words of memory 82 and the odd words of array 80 packed to the second five words of memory 82.

Figure 6B:
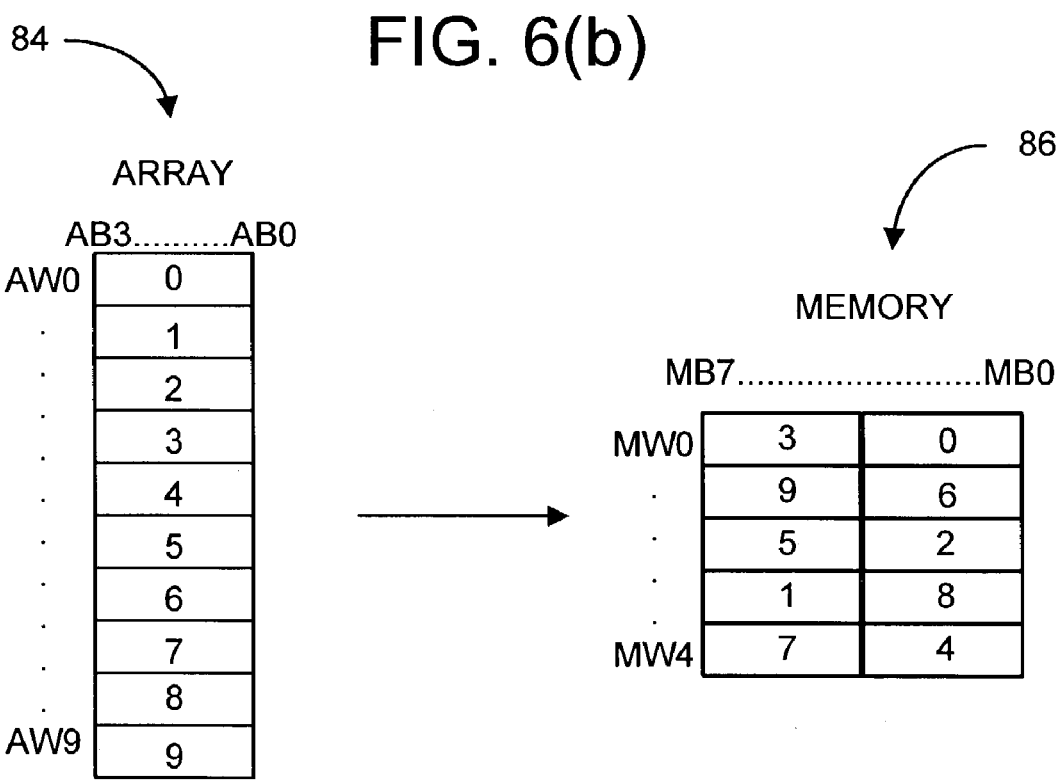
FIG. 6(b) is another illustration of packing an array into memory in an interlacing format.

FIG. 6(b) is another illustration of packing an array into memory in an interlacing format. In this example, only two words are skipped between each word of array 84 packed to memory 86, and memory 86 is twice the word width of array 84. Therefore, the first two words of array 84 to be packed to memory 86, words 0 and 3, are packed to the first word of the memory 86. Likewise, words 6 and 9 of array 84 are then packed to the next word of memory 86, and so on.

FIG. 7(a) is an illustration of packing a single word of an array into multiple words of a memory. FIG. 7(a) shows array 90 with a width of 8 bits being packed to memory 92 with a length of 4 bits. Therefore, the array words are split so that the first half of array word 0 is packed to the first word of memory 92, and the second half of array word 0 is packed to word 1 of memory 92. The rest of the array words are split in similar fashion, such that array word 1 is split and the first half is stored in memory word 2 and the second half in memory word 3, and so on. The array words can be split and packed to the memory words in order from high order bit to low order bit, or vice versa. For instance, memory words 0 and 1 each contain half of array word 0 in memory 92. The halves of array word 0 can be packed to memory 92 in any order. The first 4 bits (AB0-AB3) of array word 0 can be packed to memory word 0, or the last four bits (AB4-AB7) of array word 0 can be packed to memory word 0.

In this case each array access results in multiple memory accesses. This decreases the performance of the design but might be a design constraint, e.g. when only certain memory word sizes are available.

Figure 7B:
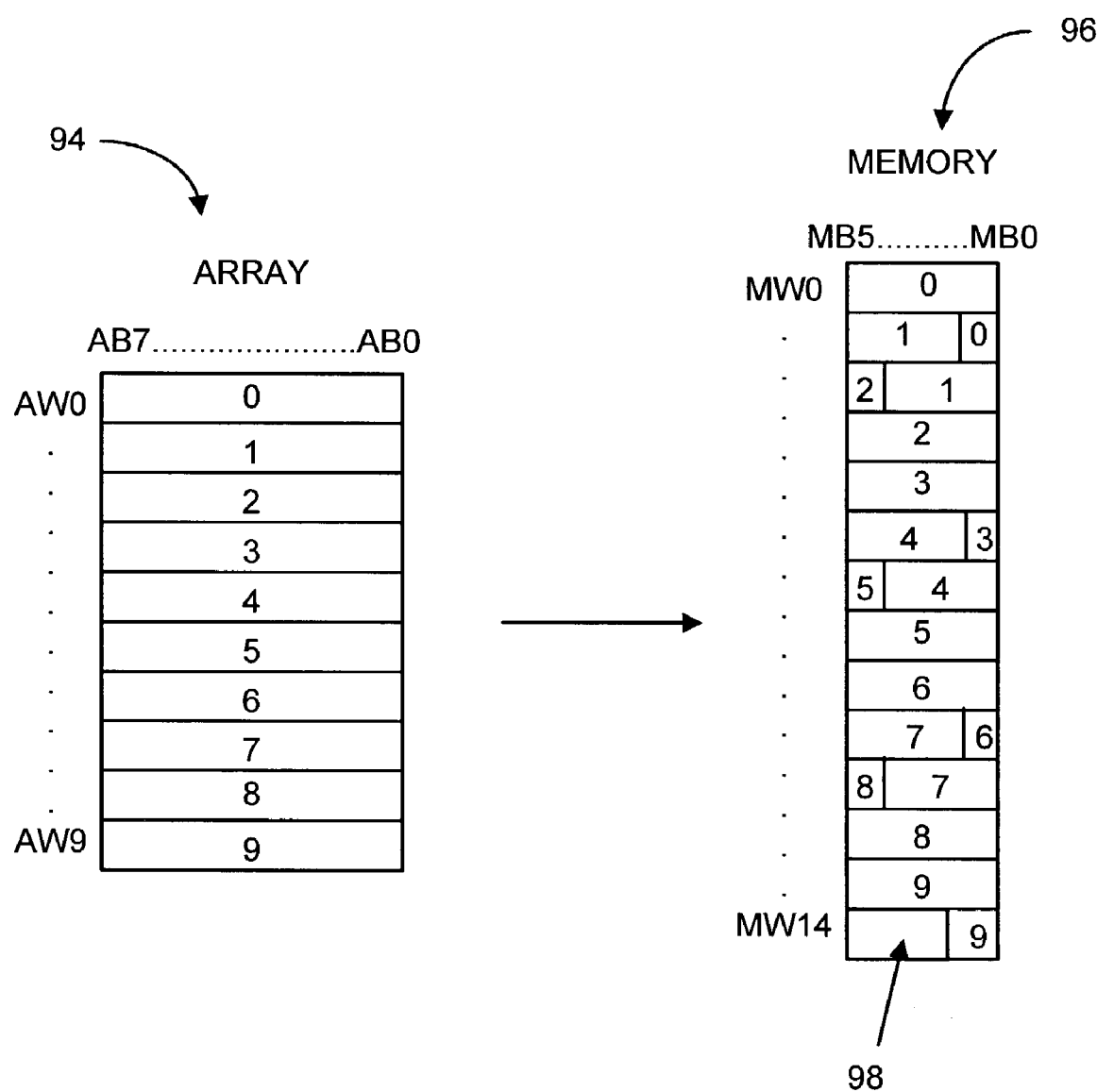
FIG. 7(b) is another illustration of packing a single word of an array into multiple words of memory.

FIG. 7(b) is another illustration of packing a single word of an array into multiple words of memory. In FIG. 7(b), array 94 with a length of 10 words and width of 8 bits is packed onto memory 96 with a width of 6 bits. Selecting a memory word size which in not an exact multiple or devisor of the array word size results in one of the more complicated addressing conversions and slicing operations. The first array word, word 0 (8 bits), is packed to memory word 0 (6 bits), and the first 2 bits of memory word 1. This leaves 4 bits of unused space in memory word 1. Therefore, the first 4 bits of the second array word, word 1, are packed to the remaining 4 bits of free space in memory word 1, and the remaining 4 bits of array word 1 are packed to memory word 2. This continues until all array words have been packed to memory 96. In this case 14 memory words are required to hold all 80 bits of array 94. This leaves 4 unused bits 98 (80 array bits packed to 6*14=84 memory bits), which may be allocated anywhere in memory 96. In FIG. 7(b), these bits 98 are allocated at the end of the memory 96.

The packing shown in FIG. 7(b), like FIG. 7(a), requires extensive calculations to address a certain array element in the memory. However, such a packing could be useful where available memories are very constrained. Because array elements are distributed over two memory elements, multiple memory accesses might be necessary for each array access.

Figure 8:
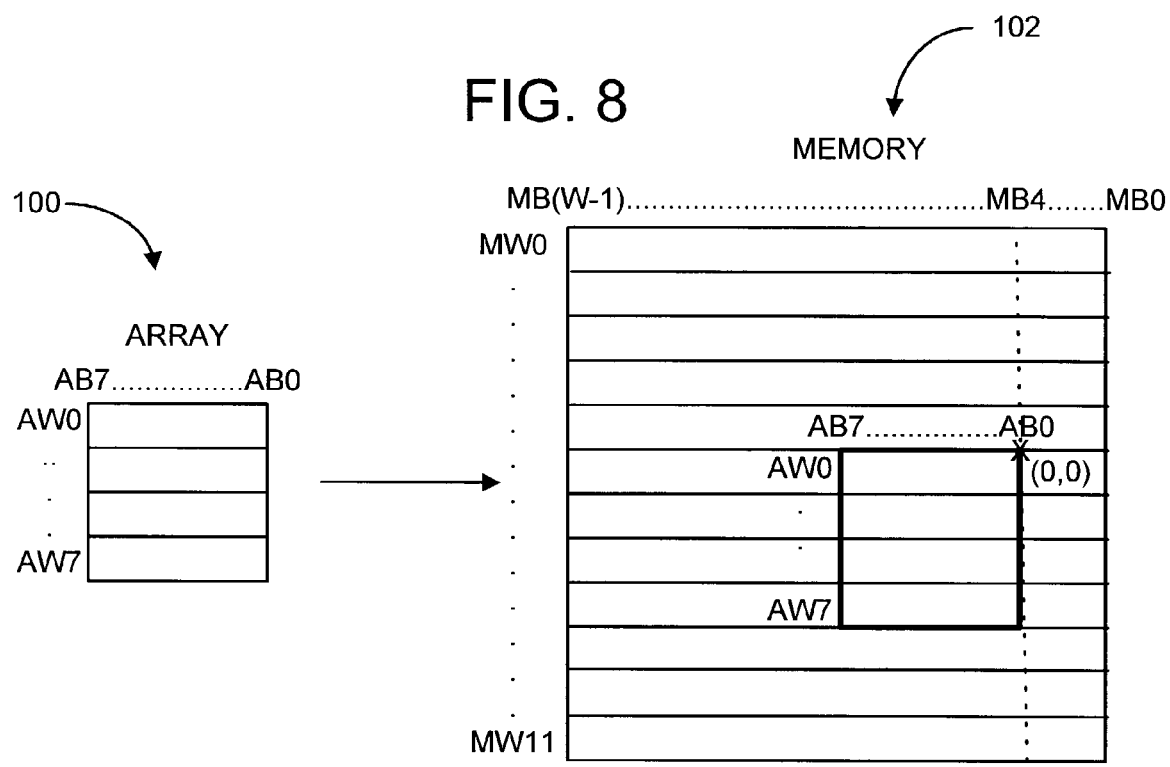
FIG. 8 is an illustration of packing an array into a customized location in a memory.

FIG. 8 is an illustration of packing an array into a customized location in a memory. Array 100 has a width of 8 bits and length of 4 words. Memory 102 is unspecified in length, but is larger than array 100 and has an array length of 12. The array 100 can be packed to any location in memory 102 large enough to be occupied by array 100. In FIG. 8, array 100 is packed such that the first word of array 100 is packed to memory word 6, and is located such that the first bit of array word 0 is packed to bit 4 of memory word 6. Each subsequent word of array 100 is packed to the subsequent word of memory 102, such that the first bit of the array word is located at bit 4 of the memory word.

Figure 9A:
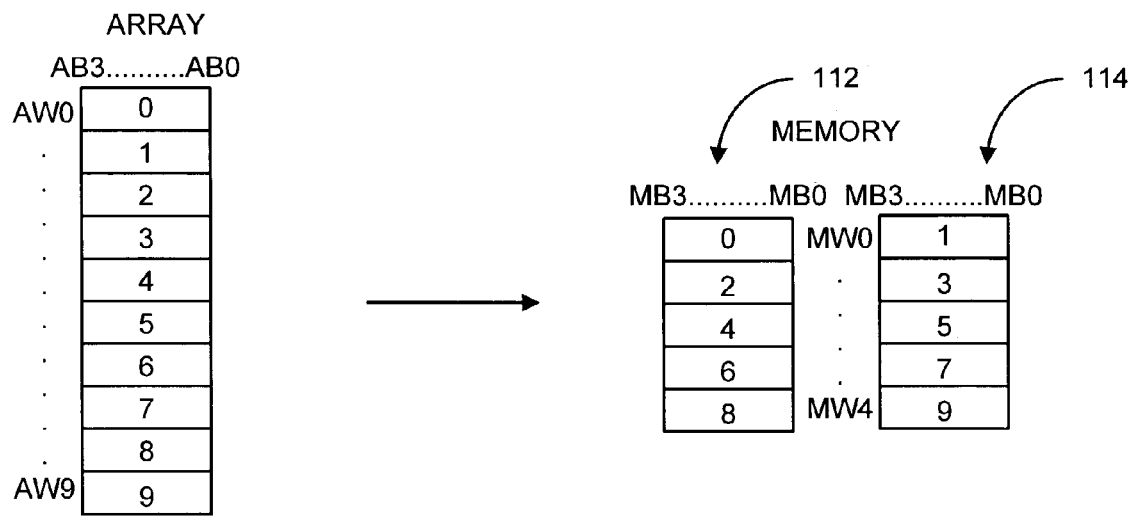
FIG. 9(a) is an illustration of packing a single array into multiple memories.

FIG. 9(a) is an illustration of packing a single array into multiple memories. Array 110 is 10 words in length and 4 bits in width. There are two memories shown, 112 and 114, each of which are 4 bits in width and 5 words in length. Array 110 can be packed to the memories in a variety of ways. For instance, array 110 can be packed to the memories 112 and 114 by alternately packing each array word to the first memory 112 and then the second 114. Such is the case in FIG. 9(a). Word 0 of array 110 is packed to word 0 of memory 112, and word 1 of array 110 is packed to word 0 of memory 114. Word 2 of array 110 is then packed to word 1 of memory 112, and word 3 of array 110 is packed to word 1 of memory 114. This format continues until the remainder of the words in array 110 are packed to memory.

Figure 9B:
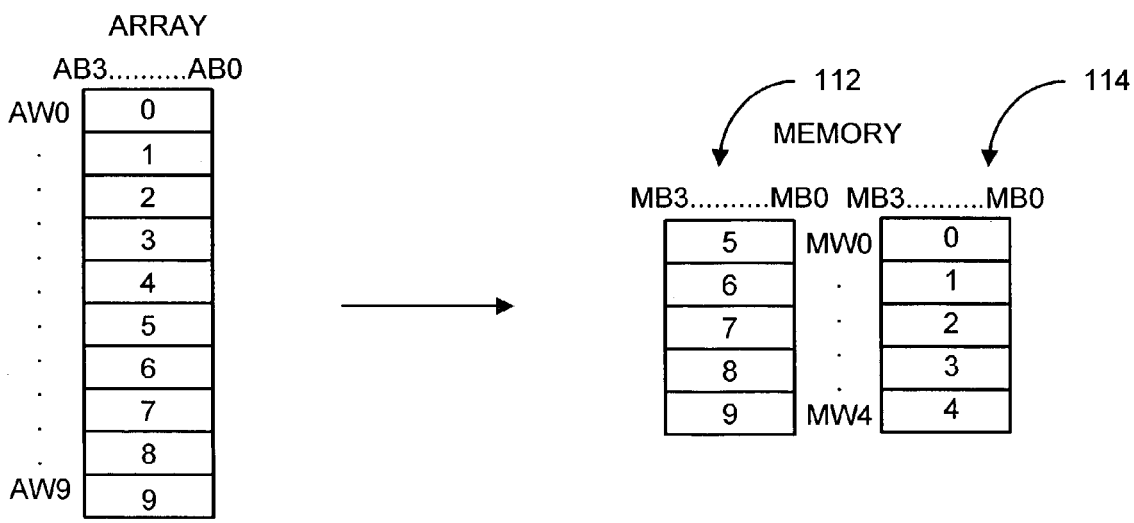
FIG. 9(b) is another illustration of packing a single array into multiple memories.

Alternatively, array 110 could also be packed such that the first 5 words of array 110 are packed sequentially into memory 112 and the second 5 words of array 110 are packed into memory 114, as shown in FIG. 9(b). Splitting an array into two separate memories increases the size of the overall circuit, but is effective in increasing the speed of the design because the two memories can be accessed independently. Thus, the designer has effectively enabled two words of array 110 to be accessed concurrently.

Figure 10:
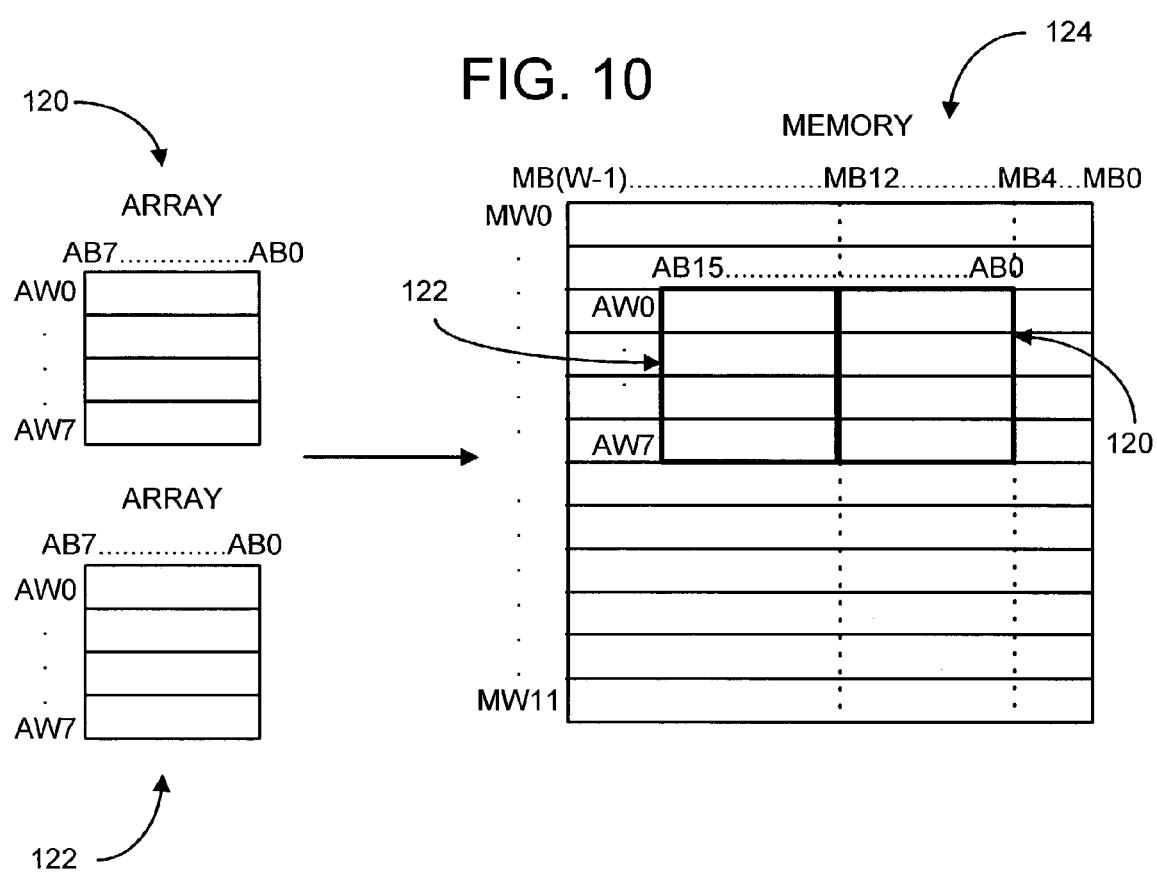
FIG. 10 is an illustration of packing multiple arrays into a single memory.

FIG. 10 is an illustration of packing multiple arrays into a single memory. Two arrays 120 and 122 are shown with a length of 4 words and width of 8 bits. The memory 124 is of an indeterminate width, but larger than arrays 120 and 122. The length of memory 124 is 12 words. Word 0 of array 120 is packed to word 2 of memory 120, with bit 0 of the array word being located at bit 4 of word 2 of memory 124. Each subsequent word of array 120 is packed to the subsequent word of memory 120 with the least significant bit of the array word located at bit 4 of the memory word.

Array 122 is packed so that it occupies space in memory 124 immediately adjacent array 120. Thus, word 0 of array 122 is packed to word 2 of memory 124, as was word 0 of array 120. However, word 0 of array 122 is displaced such that the least significant bit is located at bit 12 of the memory word. The subsequent words of array 122 are then packed to the subsequent words of memory 124, with the least significant bit of each array word located at bit 12 of the memory word.

A designer is thus given the alternative selection of increasing the speed of the circuit by packing one array onto multiple memories as shown in FIG. 9, or reducing the number of memories and therefore, the size of the circuit, by packing multiple arrays onto the same memory as shown in FIG. 10.

Figure 11:
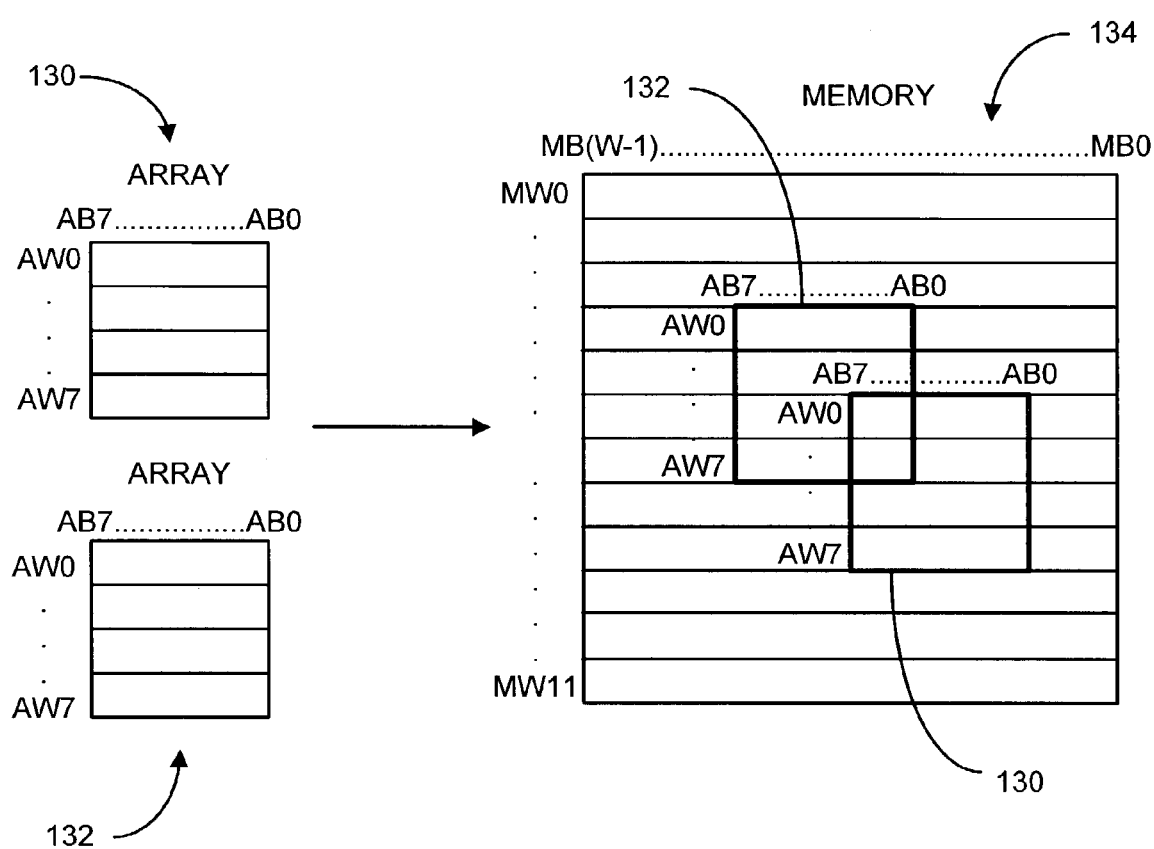
FIG. 11 is an illustration of packing multiple arrays into a single memory with the arrays overlapping in memory usage.

FIG. 11 is an illustration of packing multiple arrays into a single memory with the arrays overlapping in memory usage. The arrays 130 and 132 and memory 134 are the same dimensions as those described with respect to FIG. 10. However, in this example, arrays 130 and 132 have been packed such that the latter portions of word 0 and 1 of array 130 overlap in location with the beginning portions of words 2 and 3 of array 132. If arrays 130 and 132 have a common lifetime, then their sections must be disjoint and the packing shown will cause memory allocation errors. However, if the arrays have dissimilar lifetimes, this configuration may be an effective way of conserving memory resources.

The formats described with respect to FIGS. 3–11 allow a designer flexibility in adjusting the constraints that dictate an array layout format for packing the array into another array or into memory. For area-sensitive designs, it is tempting to merge all data into one memory; however this will constrain the memory accesses far more than if each array is packed to a separate memory. Greater speed through concurrency can be achieved by using multiple memories when available, with the drawback of a greater circuit size.

Figure 12C:
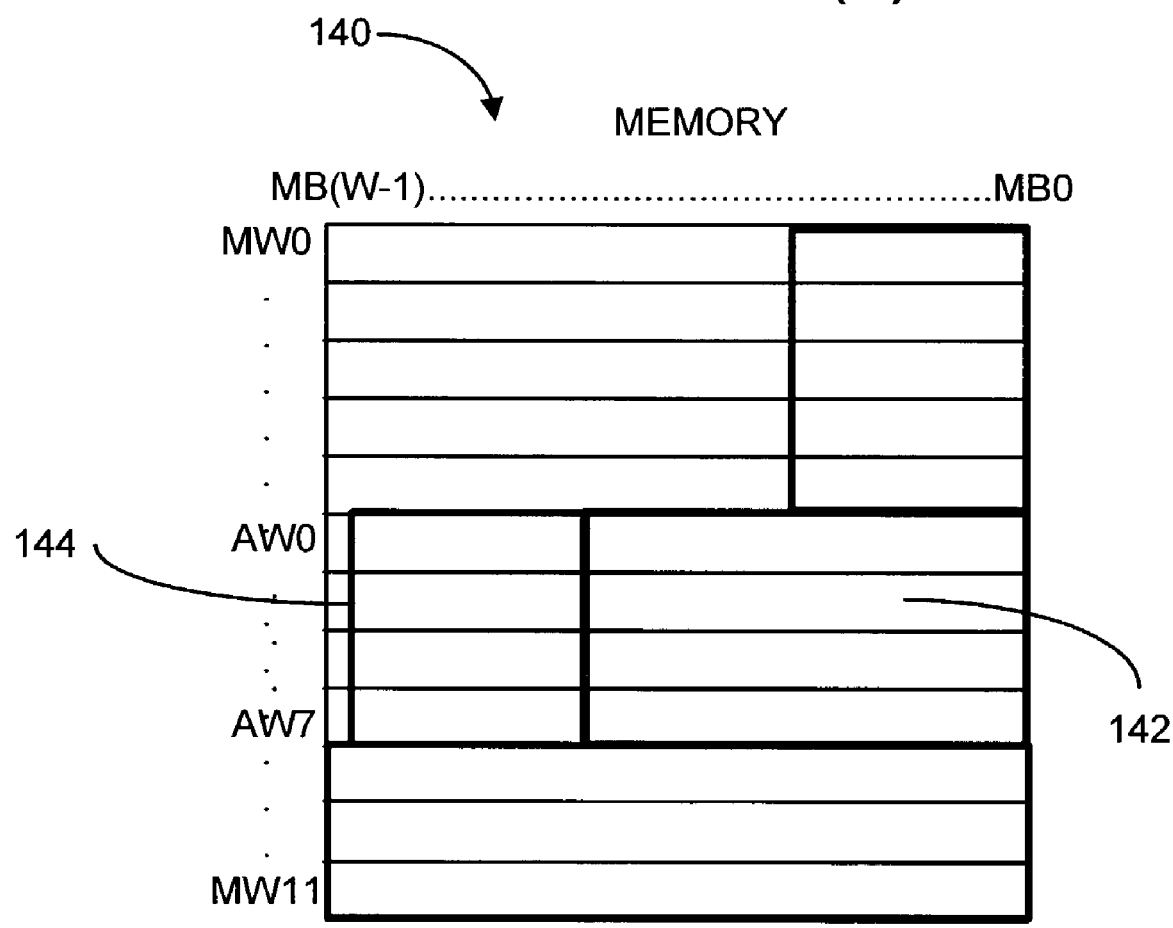
FIGS. 12(a–c) are illustrations of using resolution modes to define default behavior and correct designer error.

It is also noteworthy that the described formats can be used either in conjunction with resolution modes. FIG. 12 is an illustration of using resolution modes to set the default behavior of a design or to correct a designer error. Assume for the purposes of example that the four arrays shown in FIG. 12(a) were declared in source code read into a SIF, but only a first resolution mode was specified. Therefore, the positions of the arrays in FIG. 12(a) were determined by a set of constraints for each array according to the first resolution mode. FIG. 12(b) then shows the positions of the four arrays after the designer subsequently changed constraints corresponding to array 144 causing it to overlap with array 142. The designer can now be given the option of leaving the arrays positioned as shown in FIG. 12(b) (overlapping), changing constraints to move array 142 or 144 to an alternate position in memory to correct the problem, or have the array packed elsewhere automatically based upon the current resolution mode. Alternatively, the designer could have the array packed elsewhere in memory 140 based on a newly selected resolution mode. For instance, the designer could choose to correct the problem by selecting a second resolution mode as a basis for determining a new position for array 144, as shown in FIG. 12(c). The resolution mode can intelligently handle the task of repositioning the array 144 in a variety of ways, such as moving the array in any direction, resizing the array, packing the array to another memory resource, etc.

FIG. 13 shows an example of a user interface 150 for allowing the designer to modify memory resources interactively and dynamically. The user interface includes a display pane 152 that lists processes and array variables accessed within those processes. These processes and array variables represent the current memory allocation stored in the database 16 and are represented as graphical objects. When the synthesis tool 14 generates the data structure stored in database 16, the source code directives regarding variables and memory allocation are identified and are used as default settings for memory allocation. Using the GUI, a designer may choose to create the source code with no directives indicating memory allocation. In such a case, the designer interactively specifies the memory allocation via the GUI. Alternatively, the designer can include directives in the source code that are used as default settings.

For example, the array 154 selected in GUI 150 is a size 21 by 64, meaning it has words 64 bits in width, and length of 21 words. The display pane 152 provides a symbolic name of a resource associated with the variables. In this case, "dct_temp_rsc" is a memory resource used for the array 154, named "dct_temp". The GUI 150 shows a settings tab 156 used by the designer to change the memory allocation of the circuit using the provided constraints. The setting tab 156 in this example shows only one of the many constraints that can be provided for customizing the memory allocation of a circuit design. Here, the array word width constraint can be changed via the input window 158 to a desired width. Once a new width in entered, the display pane 154 will reflect the new width for array dct_temp. At this point the designer may make other changes such as the format of array dct_temp, other arrays, change the memory type, etc. Or, if he is satisfied, he can then select the "OK" button to apply the changes to the SIF.

Figure 14:
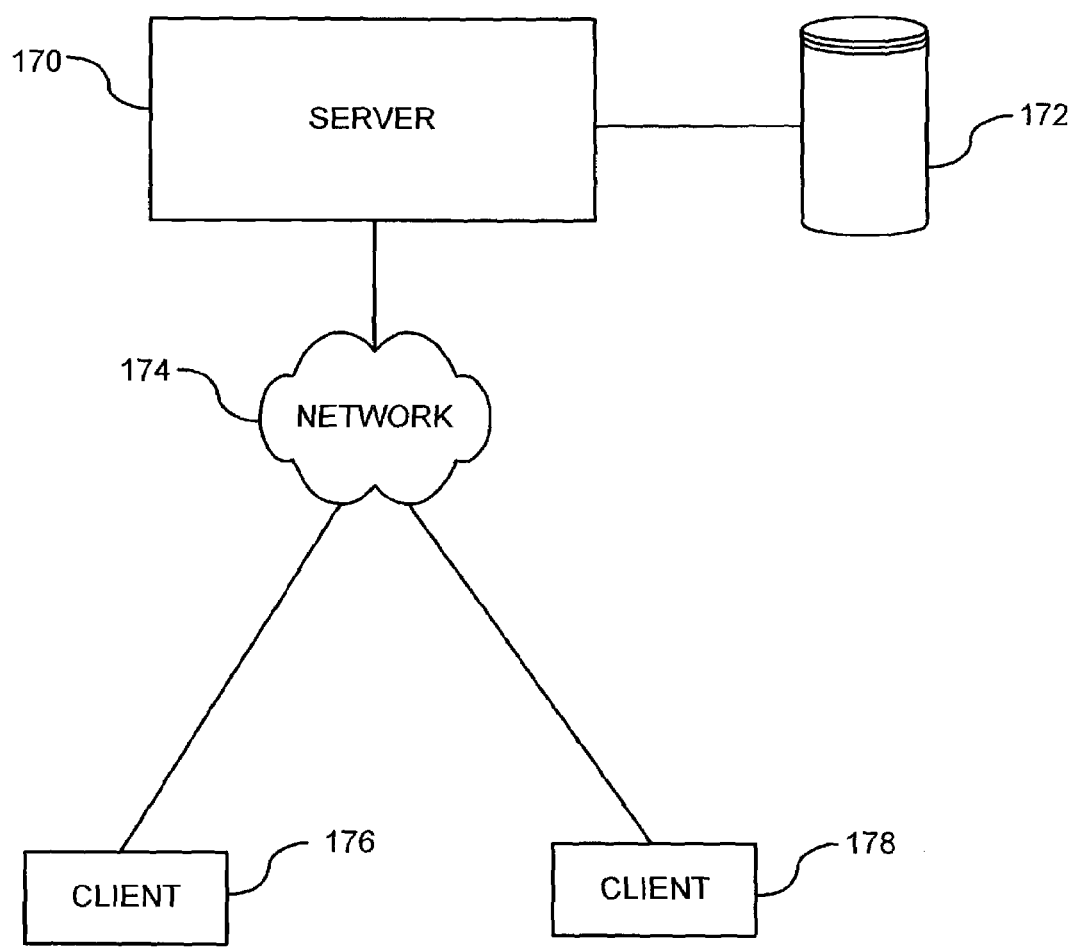
FIG. 14 is a block diagram of an embodiment of a network environment for implementing a behavioral synthesis tool.

Any of the aspects of the methods, systems and behavioral synthesis tools described above may be performed in a distributed computer network. FIG. 14 shows an exemplary network. A server computer 170 may have an associated storage device 172 (internal or external to the server computer). The server computer 170 may be configured to perform any of the implementations of the method described above. The server computer 170 may be coupled to a network, shown generally at 174. One or more client computers, such as those shown at 176, 178, may be coupled to the network 174 and interface with the server computer 170 using a network protocol.

Figure 15:
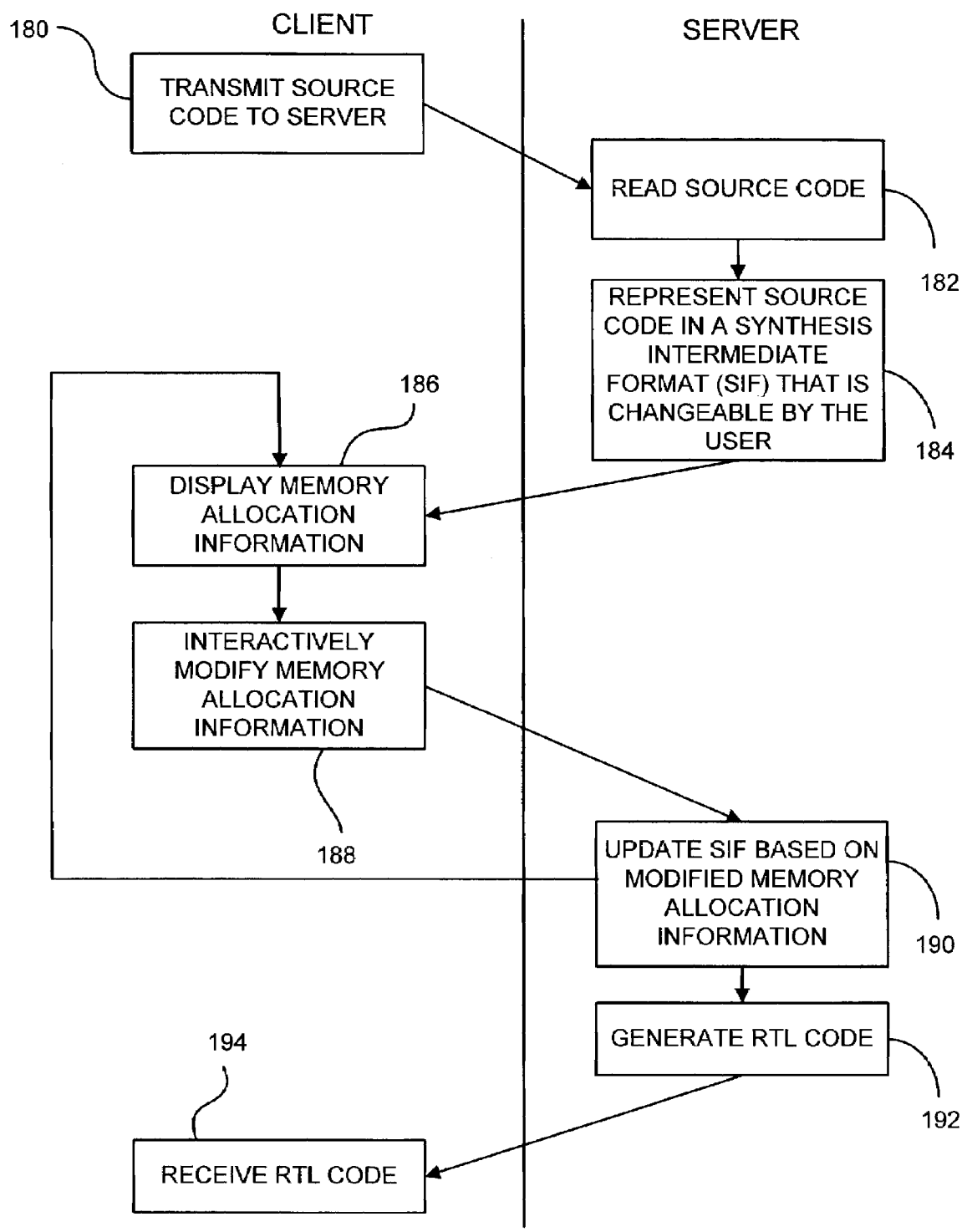
FIG. 15 is a block diagram of an embodiment of a system to carry out methods, systems and tools in accordance with the present invention.

FIG. 15 shows that a GUI or alternative means for allowing a user to alter memory allocation may be provided on a client. The client then interacts with a server for providing other aspects of a behavioral synthesis tool. For instance, in process block 180, the client computer transmits source code describing the behavior of a circuit. The source code could be an original source code or could be an updated version of previously sent source code. In process block 182, the source code is received and read into a behavior synthesis tool provided by the server. The source code is then represented in a SIF in process block 184 that allows memory allocation constraints to be modified by the client. In process block 186, memory allocation information, such as memory allocation constraints, is transmitted to the client for display to a user. The client can modify the memory allocation information if they so desire in process block 184, or approve the constraints and leave them unmodified. If the user modifies the constraints, the modifications are transmitted to the server where process block 190 updates the memory allocation in the SIF based upon the modifications, and process blocks 186 and 188 can be repeated until the user approves the current memory allocation. When the user does approve the memory allocation, process block 192 is processed to create RTL code from the SIF containing the approved memory allocation. Process block 194 then shows the client receiving the RTL code from the server.

Having illustrated and described the principles of the illustrated embodiments, it will be apparent to those skilled in the art that the embodiments can be modified in arrangement and detail without departing from such principles.

For example, although a particular GUI was shown, the user interface can be modified to illustrate the variables and resources in a different way. The particular user interface used is not important to the invention.

Also, the transformation of arrays from one format to another during the packing process can be accomplished in a variety of ways. For instance, an array of a first format can be transformed into an intermediate array in a second format, and then directly packed into a memory. Alternatively, the array of the first format can be transformed as it is being packed into the memory, such that the array is then stored in memory in the desired second format.

Although the formats and methods described herein are generally illustrated in isolation for purposes of clarity, one of skill in the art will recognize that the methods and formats for transforming array layout described herein may be combined or modified. For instance, an array being packed into a customized location, such as shown in FIG. 8, may be packed to the customized location in either of the Endian formats shown in FIG. 5, or packed in an interlacing format as shown in FIGS. 6(a) and 6(b).

Additionally, the data structure stored in database 16 can be structured in a wide variety of ways. The particular data structure used is not important to the invention.

Moreover, although the description focuses on arrays, variables that are associated with single registers in an integrated circuit may also be modified using the formats or tools described. Furthermore, any single variable or non-array data can be represented as an array and processed by embodiments of the described behavioral synthesis tool.

Although a particular data structure is illustrated, those skilled in the art recognize that a wide variety of data structures may be used.

In view of the many possible embodiments to which the principles of our invention may be applied, it should be recognized that the illustrated embodiment is only a preferred example of the invention and should not be taken as a limitation on the scope of the invention. Rather, the scope of the invention is defined by the following claims. We therefore claim as our invention all that comes within the scope of these claims.

We claim:

1. A method of reorganizing an array layout in a behavioral synthesis tool used to design an integrated circuit, comprising:
    reading a source code description associated with the integrated circuit into the behavioral synthesis tool, the source code description having at least one array in a first layout format;
    storing the source code description in an intermediate data structure within the behavioral synthesis tool; and
    transforming the array layout from the first layout format to a second layout format, the first layout format and the second layout format being associated with the manner of implementing the at least one array in the integrated circuit, wherein transforming includes packing the array into a memory resource or a second array, and wherein packing further comprises at least one of the following:
    packing more than one word of the array into each word of the memory or the second array,
    packing the array to the memory or the second array in a little endian format,
    packing the array to the memory or the second array in a big endian format,
    packing the array into the memory or the second array in an interlacing format,
    packing a single word of the array into multiple words of the memory or the second array,
    packing the array into a customized location in the memory or the second array, or
    packing the array to a specified bit location within a specified word of the memory or the second array.

2. The method of claim 1 further comprising modifying how multiple arrays are packed.

3. The method of claim 2 wherein the modifying is done prior to the transformation.

4. The method of claim 2 wherein a constraint specifies a mode that determines how to pack the multiple arrays.

5. The method of claim 4 wherein the specified mode additionally represents a method for correcting possible memory allocation errors.

6. The method of claim 1 wherein transforming the array layout comprises modifying at least one constraint associated with how the array layout will be transformed to the second layout format.

7. The method of claim 6 wherein the constraint is modified by editing the source code description.

8. The method of claim 6 wherein the constraint is modified using a graphical user interface.

9. The method of claim 6 wherein at least one constraint designates at least one of the following: the type of memory resource, whether the memory resource will be on-chip or off-chip, whether the memory resource will be single-port or multi-port, or whether the memory resource will be synchronous or asynchronous.

10. A computer-readable medium having computer-executable instructions for performing the method of claim 1.

11. A method of reorganizing an array layout in a behavioral synthesis tool used to design an integrated circuit, comprising:
    reading a source code description associated with the integrated circuit into the behavioral synthesis tool, the source code description having at least one array in a first layout format;
    storing the source code description in an intermediate data structure within the behavioral synthesis tool; and
    transforming the array layout from the first layout format to a second layout format, the first layout format and the second layout format being associated with the manner of implementing the at least one array in the integrated circuit, wherein transforming includes packing the array into a memory resource or a second array, and wherein packing the array comprises packing the array into the memory resource or the second array in a little endian format or a big endian format.

12. The method of claim 11 wherein packing the array into the memory resource or the second array further comprises directly packing each word of the array into a corresponding word of the memory resource or second array in sequential order.

13. The method of claim 11 wherein packing the array into the memory resource or the second array further comprises packing more than one word of the array into each word of the memory resource or second array.

14. The method of claim 12 wherein packing the array into the memory resource or the second array further comprises packing the array into the memory resource or second array in an interlacing format.

15. The method of claim 12 wherein packing the array into the memory resource or the second array further comprises packing a single word of the array into multiple words of the memory resource or second array.

16. The method of claim 12 wherein packing the array into the memory resource or the second array further comprises packing the array into a customized location in the memory resource or second array.

17. The method of claim 12 wherein packing the array into the memory resource or the second array further comprises packing the array to a specified bit location within a specified word of the memory resource or second array.

18. The method of claim 12 wherein packing the array into the memory resource or the second array further comprises packing the array into multiple memory resources or multiple arrays.

19. The method of claim 12 wherein packing the array into the memory resource or the second array further comprises packing multiple arrays into the memory resource or second array.

20. The method of claim 12 wherein packing the array into the memory resource or the second array further comprises packing multiple arrays into the memory resource or second array such that the arrays at least partially overlap in location within the memory resource or second array.

21. A synthesis tool that allows for interactive memory allocation in the design of integrated circuits, comprising:
    a source code description file that describes functionality of an integrated circuit and references at least one array; and
    a first memory that stores an intermediate database associated with the source code description file of the integrated circuit,
    wherein the synthesis tool allows a user to modify the intermediate database in order to change the method for transforming an array from a first format to a second format, the first format and the second format being associated with how the at least one array will be allocated in memory of the integrated circuit, and wherein the second format is one of a little endian format or a big endian format.

22. The synthesis tool of claim 21 wherein the transforming includes packing the array into a second memory or a second array.

23. The synthesis tool of claim 21 further comprising modifying how multiple arrays are packed.

24. The synthesis tool of claim 23 wherein a constraint specifies a mode that determines how to pack the multiple arrays.

25. The synthesis tool of claim 24 wherein the specified mode additionally represents a method for correcting possible memory allocation errors.

26. The synthesis tool of claim 21 wherein modifying the database in order to transform an array from the first format to the second format comprises modifying at least one constraint associated with how the array is transformed to the second format.

27. The synthesis tool of claim 26 wherein the constraint is modified by editing the source code description file.

28. The synthesis tool of claim 26 wherein the constraint is modified using a graphical user interface.

29. The synthesis tool of claim 21 wherein the method for transforming an array from a first format to a second format comprises directly packing each word of the array into a corresponding word.

30. The synthesis tool of claim 21 wherein the method for transforming an array from a first format to a second format comprises packing more than one word of the array into a single word.

31. The synthesis tool of claim 21 wherein the second format is also an interlacing format.

32. The synthesis tool of claim 21 wherein the method for transforming an array from a first format to a second format comprises packing a single word of the array into multiple words.

33. The synthesis tool of claim 21 wherein the method for transforming an array from a first format to a second format comprises increasing the size of the array.

34. The synthesis tool of claim 21 wherein the method for transforming an array from a first format to a second format comprises packing a word of the array into a specified bit location within a specified word.

35. The synthesis tool of claim 21 wherein the method transforming an array from a first format to a second format comprises splitting the array.

36. The synthesis tool of claim 21 wherein the method for transforming an array from a first format to a second format comprises combining multiple arrays.

37. The synthesis tool of claim 21 wherein the method for transforming an array from a first format to a second format comprises combining multiple arrays so that at least one word of the arrays overlaps another.

38. A method of synthesizing an integrated circuit comprising:

reading a source code description of an integrated circuit having at least one array;

storing the source code description in a database;

allowing a user to modify a plurality of parameters associated with how the array in the source code description will be packed to a memory or a second array;

modifying the database in response to the user modifying the parameters;

generating register-transfer level code from the modified database; and synthesizing a circuit from the register-transistor level code, wherein the parameters are modified such that packing the array in the source code description to the memory or second array comprises one of the following:

directly packing each word of the array into a corresponding word of the memory or second array in sequential order, packing more than one word of the array into each word of the memory or second array, packing the array to the memory or second array in a little endian format, packing the array to the memory or second array in a big endian format, packing the array into the memory or second array in an interlacing format, packing a single word of the array into multiple words of the memory or second array, packing the array into a customized location in the memory or second array, packing the array to a specified bit location within a specified word of the memory or second array, packing a single array into multiple memories or arrays, packing multiple arrays into the memory or second array, or packing multiple arrays into the memory or second array such that the arrays at least partially overlap in location within the memory or second array.

39. The method of claim 38 wherein the parameters are modified by editing the source code.

40. The method of claim 38 wherein the parameters are modified using a graphical user interface.

41. A client computer displaying a graphical user interface for interacting with or using a server computer according to a method, the client and server computers communicating via a network, the method being a method of reorganizing an array layout in a behavioral synthesis tool used to design an integrated circuit, comprising:

reading a source code description associated with the integrated circuit into the behavioral synthesis tool, the source code description having at least one array in a first layout storing the source code description in an intermediate data structure within the behavioral synthesis tool; and transforming the array layout from the first layout format to a second layout format, the first layout format and the second layout format being associated with the manner of implementing the at least one array in the integrated circuit, wherein transforming includes packing the array into a memory resource or a second array, and wherein packing further comprises at least one of the following:

packing more than one word of the array into each word of the memory or the second array, packing the array to the memory or the second array in a little endian format, packing the array to the memory or the second array in a big endian format, packing the array into the memory or the second array in an interlacing format, packing a single word of the array into multiple words of the memory or the second array, packing the array into a customized location in the memory or the second array, or packing the array to a specified bit location within a specified word of the memory or the second array.

42. A client computer displaying a graphical user interface for interacting with or using a synthesis tool, the synthesis tool being implemented on a server computer, and the client and server computers communicating via a network, the synthesis tool comprising a source code description file that describes functionality of an integrated circuit and references at least one array; and a first memory that stores an intermediate database associated with the source code description file of the integrated circuit, wherein the synthesis tool allows a user to modify the intermediate database in order to change the method for transforming an array from a first format to a second format, the first format and the second format being associated with how the at least one array will be allocated in memory of the integrated circuit, and wherein the second format is one of a little endian format or a big endian format.

43. A method of reorganizing an array layout in a behavioral synthesis tool used to design an integrated circuit, comprising:

reading a source code description associated with the integrated circuit into the behavioral synthesis tool, the source code description having at least one array in a first layout format;

storing the source code description in an intermediate data structure within the behavioral synthesis tool; and transforming the array layout from the first layout format to a second layout format, the first layout format and the second layout format being associated with the manner of implementing the at least one array in the integrated circuit, wherein the transforming includes packing the array into a memory resource or a second array, and wherein packing the array into a memory resource or a second array comprises packing the array to the memory resource or second array using a combination of two or more of the following:

directly packing each word of the array into a corresponding word of the memory resource or second array in sequential order, packing more than one word of the array into each word of the memory resource or second array, packing the array to the memory resource or second array in a little endian format, packing the array to the memory resource or second array in a big endian format, packing the array into the memory resource or second array in an interlacing format, packing a single word of the array into multiple words of the memory resource or second array, packing the array into a customized location in the memory resource or second array, packing the array to a specified bit location within a specified word of the memory resource or second array, packing a single array into multiple memory resources or arrays, packing multiple arrays into the memory resource or second array, or packing multiple arrays into the memory resource or second array such that the arrays at least partially overlap in location within the memory resource or second array.

44. A synthesis tool that allows for interactive memory allocation in the design of integrated circuits, comprising:

a source code description file that describes functionality of an integrated circuit and references at least one array; and a first memory that stores an intermediate database associated with the source code description file of the integrated circuit, wherein the synthesis tool allows a user to modify the intermediate database in order to change the method for transforming an array from a first format to a second format, the first format and the second format being associated with how the at least one array will be allocated in memory of the integrated circuit, wherein the method for transforming an array from a first format to a second format comprises using a method that comprises a combination of two or more of the following:

directly packing each word of the array into a corresponding word, packing more than one word of the array into a single word, using a little endian format, using a big endian format, using an interlacing format, packing a single word of the array into multiple words, increasing the size of the array, packing a word of the array into a specified bit location within a specified word, splitting the array, combining multiple arrays, or combining multiple arrays so that at least one word of the arrays overlaps another.

* * * * *